(12) United States Patent
Jeon et al.

(10) Patent No.: US 11,171,038 B2
(45) Date of Patent: Nov. 9, 2021

(54) FABRICATION METHOD OF INTEGRATED CIRCUIT SEMICONDUCTOR DEVICE

(71) Applicant: Samsung Electronics Co., Ltd., Suwon-si (KR)

(72) Inventors: Namho Jeon, Hwaseong-si (KR); Joonyoung Choi, Suwon-si (KR); Jiyoung Kim, Yongin-si (KR); Junsoo Kim, Seongnam-si (KR); Dongsoo Woo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/744,446

(22) Filed: Jan. 16, 2020

(65) Prior Publication Data
US 2020/0395241 A1   Dec. 17, 2020

(30) Foreign Application Priority Data

Jun. 14, 2019   (KR) ........................ 10-2019-0071068

(51) Int. Cl.
*H01L 21/762* (2006.01)
*H01L 27/12* (2006.01)
*H01L 21/84* (2006.01)
*H01L 27/108* (2006.01)

(52) U.S. Cl.
CPC ........ *H01L 21/76283* (2013.01); *H01L 21/84* (2013.01); *H01L 27/10876* (2013.01); *H01L 27/1203* (2013.01)

(58) Field of Classification Search
CPC .............. H01L 21/76283; H01L 21/84; H01L 27/1203; H01L 27/10876; H01L 27/10814; H01L 29/66795

USPC .................................. 438/424, 425; 257/192
See application file for complete search history.

(56) References Cited

U.S. PATENT DOCUMENTS

| 7,795,678 B2 | 9/2010 | Park et al. |
| 8,012,833 B2 | 9/2011 | Im |
| 8,338,246 B2 | 12/2012 | Im |
| 8,394,703 B2 | 3/2013 | Ohnuma et al. |
| 8,932,927 B2 | 1/2015 | Zhou et al. |

(Continued)

FOREIGN PATENT DOCUMENTS

| KR | 10-0618796 B1 | 8/2006 |
| KR | 10-0899646 B1 | 5/2009 |
| KR | 10-2010-0110534 A | 10/2010 |

OTHER PUBLICATIONS

T. Sato et al., 'SON (Silicon on Nothing) MOSFET using ESS (Empty Space in Silicon) technique for SoC applications' *IEEE*, Aug. 2002.

*Primary Examiner* — Thinh T Nguyen
(74) *Attorney, Agent, or Firm* — Harness, Dickey & Pierce, P.L.C.

(57) ABSTRACT

A fabrication method of an integrated circuit semiconductor device includes: forming a plurality of low dielectric pattern apart from each other on a substrate, the plurality of low dielectric pattern having a lower dielectric constant than the substrate; after forming the low dielectric pattern, forming a flow layer to bury the low dielectric pattern on the substrate; forming an epitaxial layer on the flow layer; and forming a transistor in the substrate comprising the low dielectric pattern buried by the flow layer and in the epitaxial layer.

20 Claims, 37 Drawing Sheets

(56) References Cited

U.S. PATENT DOCUMENTS

2009/0072344 A1* 3/2009 Im .................. H01L 21/823481
                                                              438/226
2009/0224287 A1* 9/2009 Shin et al. ............ H01L 29/165
                                                              257/192

* cited by examiner

FABRICATION METHOD OF INTEGRATED CIRCUIT SEMICONDUCTOR DEVICE

CROSS-REFERENCE TO RELATED APPLICATION

This application claims the benefit of Korean Patent Application No. 10-2019-0071068, filed on Jun. 14, 2019, in the Korean Intellectual Property Office, the disclosure of which is incorporated herein in its entirety by reference.

BACKGROUND

The inventive concepts relate to a fabrication method of an integrated circuit semiconductor device, and more particularly, to a fabrication method of an integrated circuit semiconductor device capable of suppressing an interference effect between transistors.

As integrated circuit semiconductor devices become more integrated, the size of transistors in the integrated circuit semiconductor devices decreases. As a result, an interference effect may occur, and the transistors in the integrated circuit semiconductor devices may electrically or physically interfere with each other. When the interference effect of the transistors increases in this manner, it becomes difficult to fabricate integrated circuit semiconductor devices, and accordingly, the reliability of the manufactured integrated circuit semiconductor devices is reduced.

SUMMARY

Some example embodiments provide a fabrication method of an integrated circuit semiconductor device capable of suppressing an interference effect between transistors.

According to an example embodiment, a fabrication method of an integrated circuit semiconductor device includes: forming a plurality of low dielectric pattern apart from each other on a substrate, the plurality of low dielectric pattern having a lower dielectric constant than the substrate; forming a flow layer to bury the low dielectric pattern in the substrate; forming an epitaxial layer on the flow layer; and forming a transistor in the substrate comprising the low dielectric pattern buried by the flow layer and in the epitaxial layer.

According to an example embodiment, a fabrication method of an integrated circuit semiconductor device including: forming a plurality of trenches apart from each other on a substrate; forming a low dielectric pattern having a lower dielectric constant than the substrate inside the trenches; forming a flow layer to bury the low dielectric pattern inside the trenches; forming an epitaxial layer on the flow layer; and forming a transistor in the substrate including the low dielectric pattern buried by the flow layer and in the epitaxial layer.

According to an example embodiment, a fabrication method of an integrated circuit semiconductor device including: forming a low dielectric pattern on a substrate, the low dielectric pattern having a lower dielectric constant than the substrate; forming a polysilicon layer to bury the low dielectric pattern on the substrate; forming a flow layer by flowing the polysilicon layer; forming an epitaxial layer on the flow layer; and forming a transistor in the substrate including the low dielectric pattern buried by the flow layer and in the epitaxial layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Although the terms "first," "second," "third," etc., is used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below is termed a second element, component, region, layer, or section, without departing from the scope of this disclosure.

FIGS. 1A through 10 are diagrams of a fabrication method of an integrated circuit semiconductor device in accordance with an example embodiment of the inventive concepts.

FIGS. 1A through 7A, 1D, 2C, 6C, and 7C are plan layout diagrams, and FIGS. 1B through 7B, 1C, 3C, and 8 through 10 are cross-sectional diagrams.

Figure 1A:
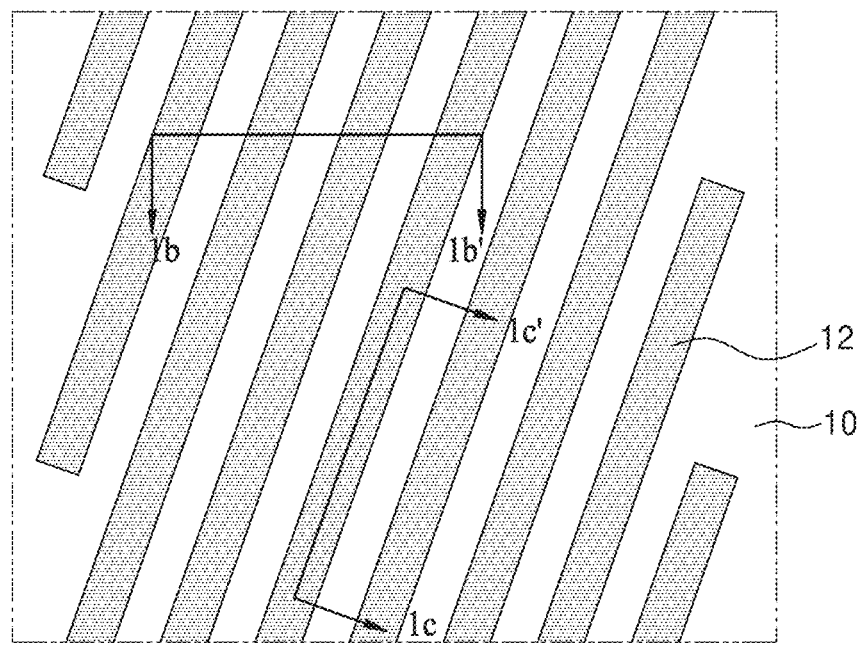
FIGS. 1A through 10 are diagrams of a fabrication method of an integrated circuit semiconductor device in accordance with an example embodiment.
Figure 1A:
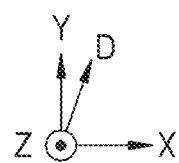
Figure 1B:
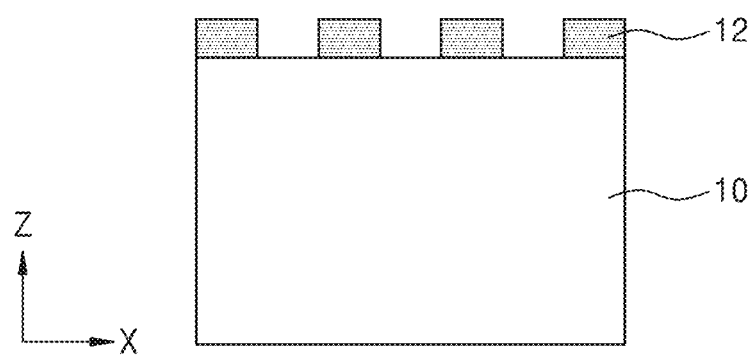
Figure 1C:
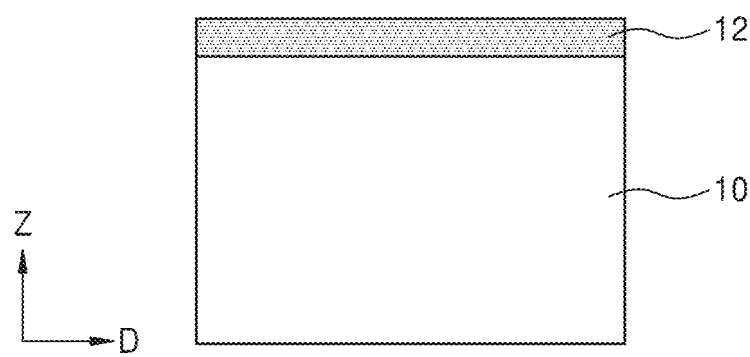
Figure 1D:
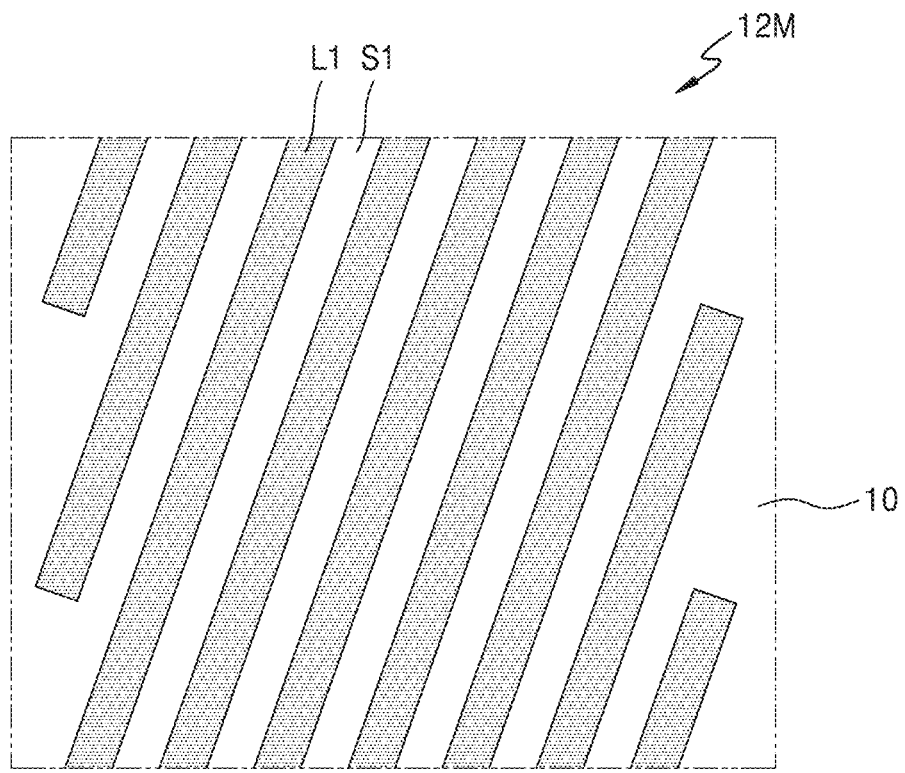

Referring to FIGS. 1A through 1D, FIG. 1A is a layout diagram of first mask patterns 12 formed on a substrate 10. FIGS. 1B and 1C is cross-sectional diagrams corresponding to lines 1b-1b' and 1c-1c' in FIG. 1A respectively. FIG. 1D is a layout diagram of a first mask 12M.

Surfaces of the substrate 10 is defined in a first direction (e.g., in an X direction), a second direction (e.g., in a Y direction) perpendicular to the first direction (X direction), and a diagonal direction (e.g., in a D direction) between the first direction and the second direction. A direction perpendicular to the top surface of the substrate 10 is a third direction (Z direction). In the following diagrams, the first direction (X direction), the second direction (Y direction), the diagonal direction (D direction), and the third direction (Z direction) is identically applied. FIG. 1B is a cross-sectional diagram in the first direction (X direction) and the third direction (Z direction). FIG. 1C is a cross-sectional diagram in the diagonal direction (D direction) and in the third direction (Z direction).

First, a plurality of first mask patterns 12 is formed on the substrate 10. The substrate 10 may include semiconductor materials such as silicon, germanium, silicon-germanium, or Group III-V semiconductor compounds such as GaP, GaAs, and GaSb.

The first mask patterns 12 is formed by using the first mask 12M including a line L1 and a space S1. Accordingly, the first mask patterns 12 may extend in the diagonal direction (D direction) on the substrate 10. The first mask patterns 12 is apart from each other in the first direction (X direction).

The first mask patterns 12 may have a line shape corresponding to the line L1 of the first mask 12M, and a space between the first mask patterns 12 may correspond to the space S1 of the first mask 12M. The first mask patterns 12 is formed by a photoresist pattern. Although the first mask patterns 12 extend in the diagonal direction (D direction) in the present embodiment, in some embodiments, the first mask patterns 12 may extend in the first direction (X direction) or the second direction (Y direction).

Figure 2A:
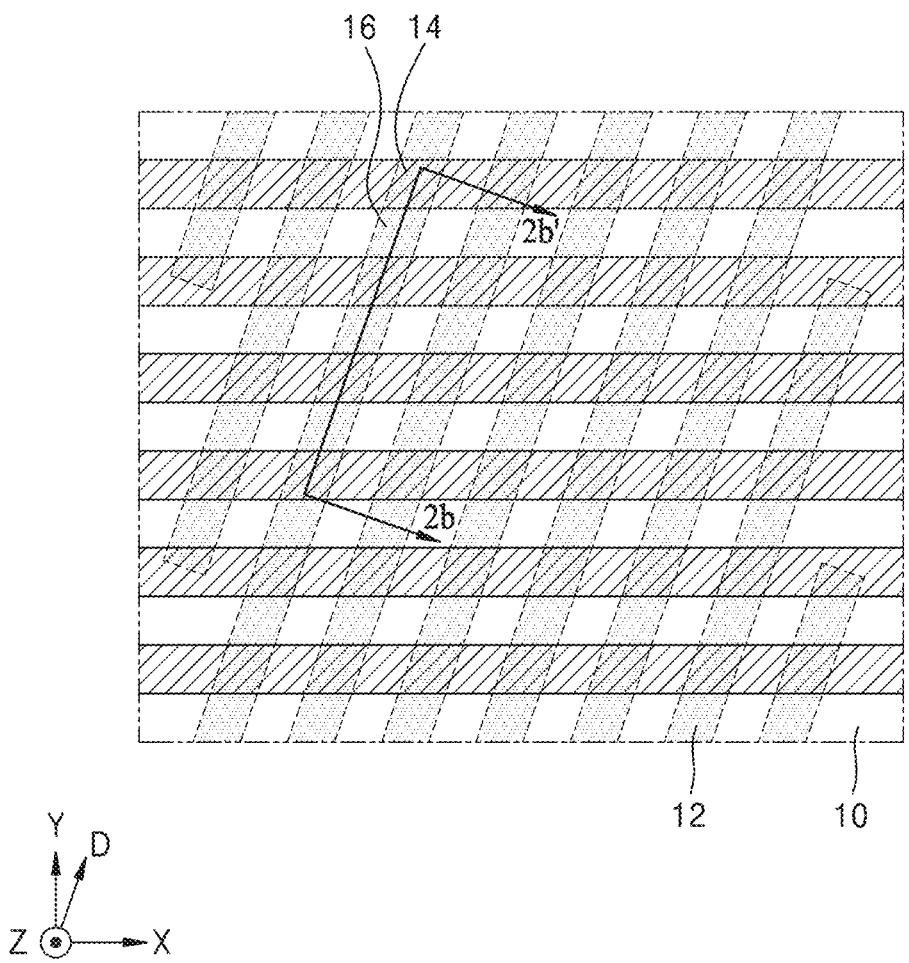
Figure 2B:
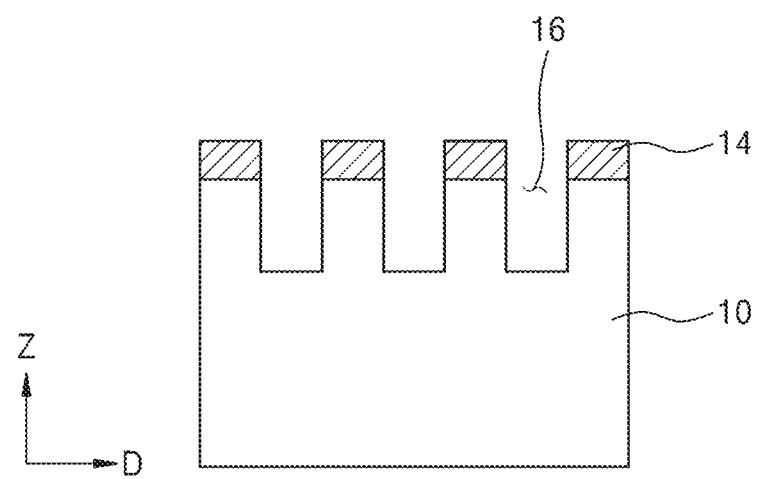
Figure 2C:
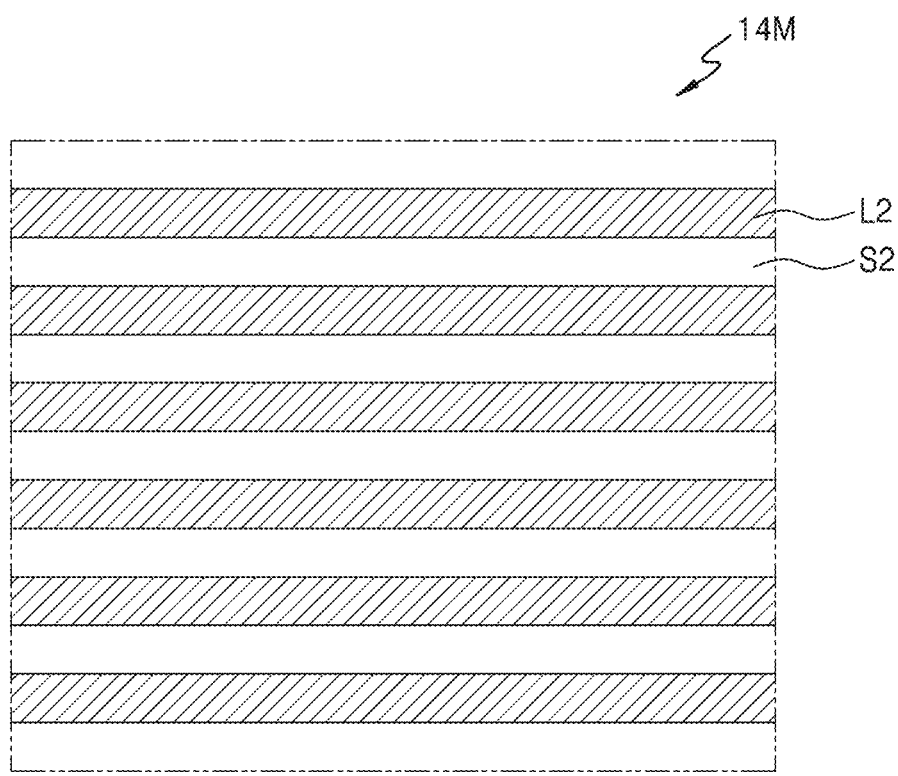

Referring to FIGS. 2A through 2C, FIG. 2A is a layout diagram in which a second mask 14 overlaps the first mask patterns 12. FIG. 2B is a cross-sectional diagram corresponding to line 2b-2b' in FIG. 2A. FIG. 2B is a cross-sectional diagram in the diagonal direction (D direction) and in the third direction (Z direction). FIG. 2C is a layout diagram of the second mask 14M.

The second mask patterns 14 is formed by etching the first mask patterns 12, which were previously formed, by using the second mask 14M. The second mask 14M may have a shape in which a line L2 and a space S2 are alternately arranged to be apart from each other in a second direction (Y direction) perpendicular to the first direction (X direction) and may form a line and space shape. The line L2 and the space S2 constituting the second mask 14M may extend in the first direction (X direction). The second mask patterns 14 is formed by a photoresist pattern.

By etching the first mask patterns 12 by using the second mask 14M, the second mask patterns 14 is formed, and also, one surface of the substrate 10 is exposed. The second mask patterns 14 is formed at portions where the first mask patterns 12 overlap the lines L2 of the second mask 14M. Next, a plurality of trenches 16 is formed by further etching the one surface of the substrate 10 by using the second mask patterns 14 as etching masks. The trenches 16 is apart from each other in the first direction (X direction) and the second direction (Y direction).

Figure 3A:
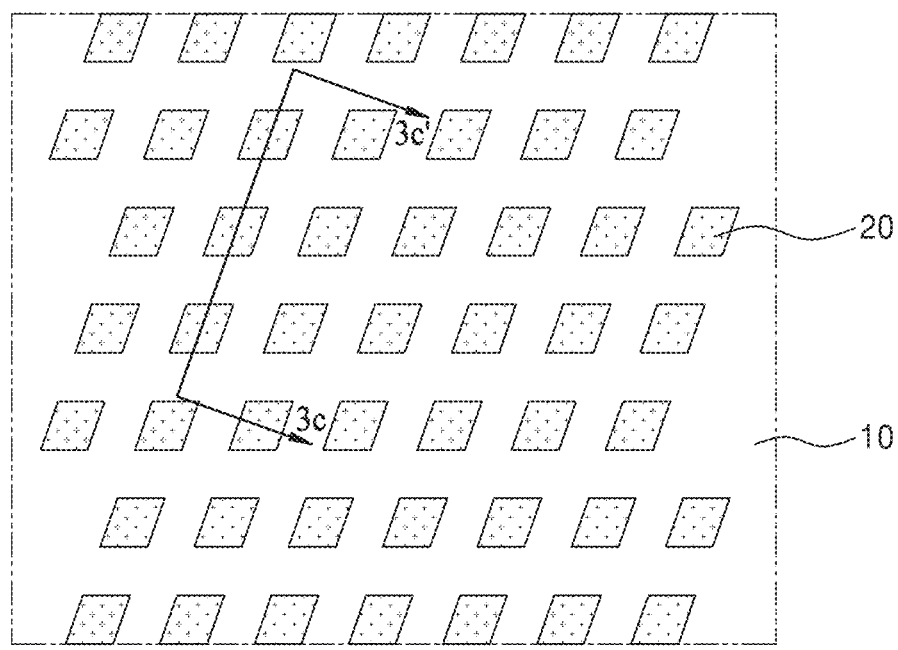
Figure 3A:
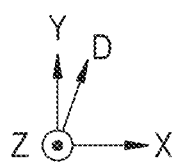
Figure 3B:
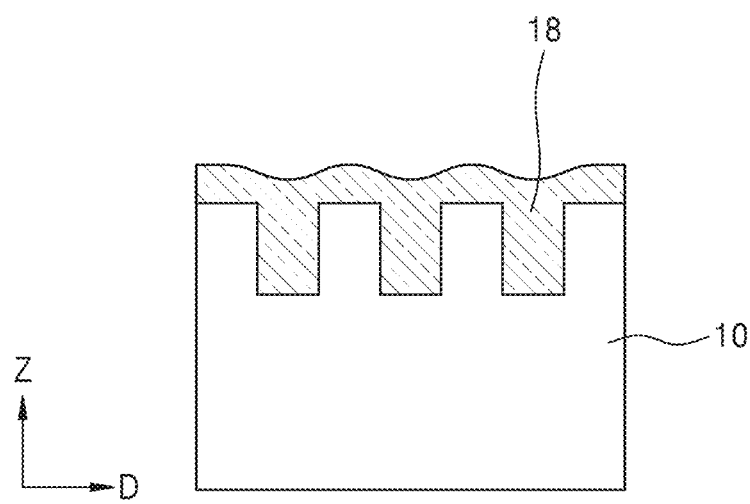
Figure 3C:
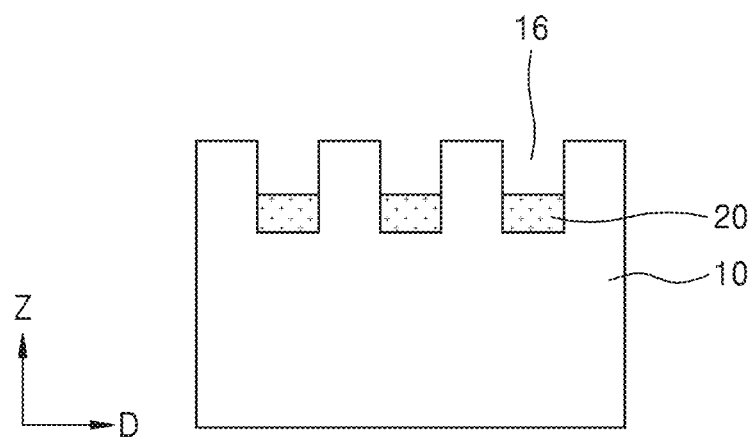

Referring to FIGS. 3A through 3C, FIG. 3A illustrates a layout diagram of a low dielectric pattern 20 in accordance with an example embodiment. FIG. 3B illustrates a cross-sectional diagram illustrating an intermediate fabrication operation of forming the low dielectric pattern 20, and FIG. 3C illustrates a cross-sectional diagram corresponding to line 3c-3c' in FIG. 3A. FIGS. 3B and 3C illustrate cross-sectional diagrams in the diagonal direction (D direction) and in the third direction (Z direction) respectively.

As illustrated in FIG. 3B, a low dielectric material layer 18 is formed on the substrate 10 while filling the inside of the trenches 16. The low dielectric material layer 18 may include a material having a lower dielectric constant than the substrate 10. For example, the low dielectric material layer 18 may include silicon oxide. When the substrate 10 includes a silicon substrate and the low dielectric material layer 18 contains silicon oxide, the dielectric constant of the substrate 10 is about 11.7 and the dielectric constant of the low dielectric material layer 18 is about 3.9, which is lower than that of the substrate 10. The permittivity is a relative permittivity.

Next, as illustrated in FIG. 3C, the low dielectric pattern 20 is formed in the trenches 16 by etch-backing the low dielectric material layer 18. In some embodiments, a height of the low dielectric pattern 20 is between about 5 nm and about 50 nm. As illustrated in FIG. 3C, a horizontal length (or a width) in the first direction (X direction) and a vertical length (or a width) in the diagonal direction (D direction) of the low dielectric pattern 20 is determined according to a size of an active region (24 in FIG. 6A), and is formed, for example, between about 5 nm and about 20 nm. The low dielectric pattern 20 is lower than the surface of the substrate 10. As illustrated in FIG. 3A, the low dielectric pattern 20 is apart from each other in the first direction (X direction) and the second direction (Y direction).

Figure 4A:
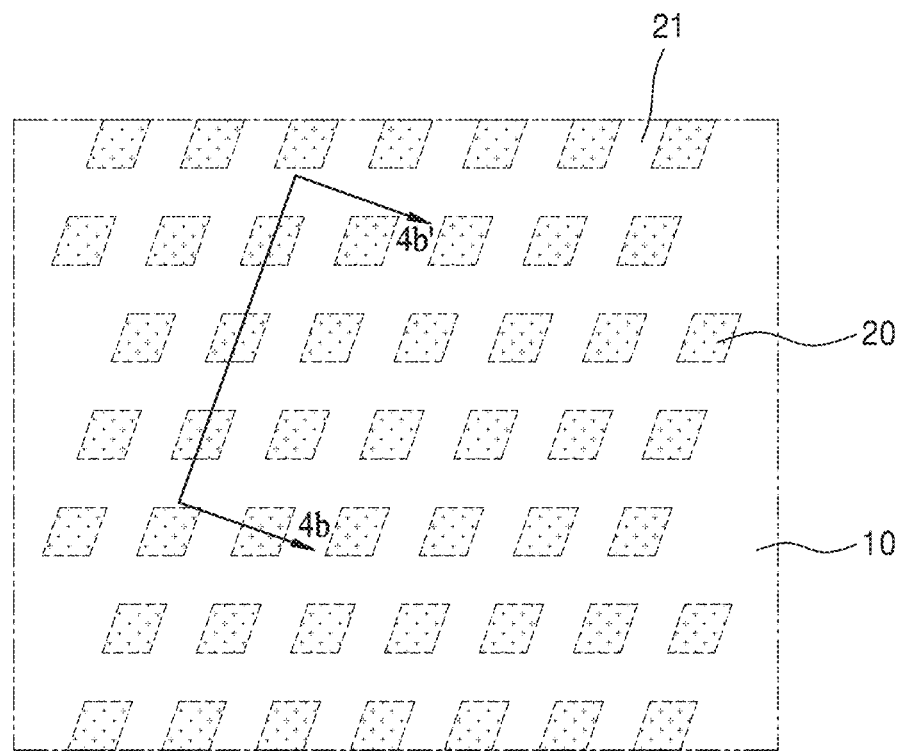
Figure 4A:
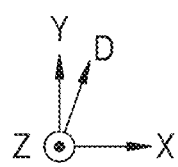
Figure 4B:
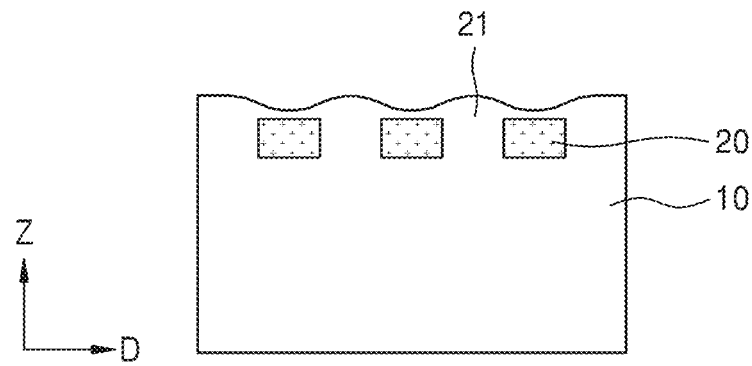

Referring to FIGS. 4A and 4B, FIG. 4A is a layout diagram of a flow layer 21 on the low dielectric pattern 20. FIG. 4B is a cross-sectional diagram corresponding to line 4b-4b' in FIG. 4A. FIG. 4B is a cross-sectional diagram in the diagonal direction (D direction) and in the third direction (Z direction).

As illustrated in FIG. 4B, the flow layer 21 burying the low dielectric pattern 20 in the trenches (16 in FIG. 3C) is formed by melting, laser annealing, or gas annealing a top portion of the substrate 10. In some embodiments, when the top portion of the substrate 10 is gas annealed, the gas used may be a gas containing hydrogen gas (e.g., hydrogen gas). In some embodiments, when the top portion of the substrate 10 is gas annealed, the gas annealing is performed by using any one or more of hydrogen, nitrogen, argon, and helium.

In some embodiments, when the substrate 10 includes a silicon layer and the low dielectric pattern 20 includes a silicon oxide layer the low dielectric pattern 20 in the trenches (16 in FIG. 3C) is buried with silicon atoms as the silicon layer melts ahead of the silicon oxide layer. When the top portion of the substrate 10 is laser annealed or gas annealed, the flow temperature of the silicon atoms is lowered.

Figure 5A:
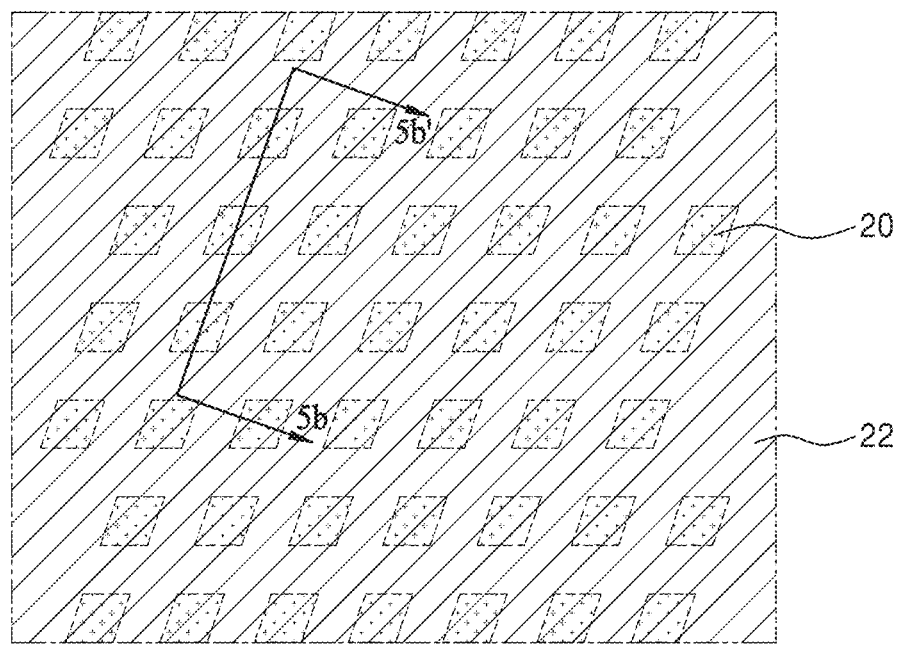
Figure 5A:
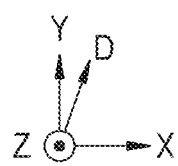
Figure 5B:
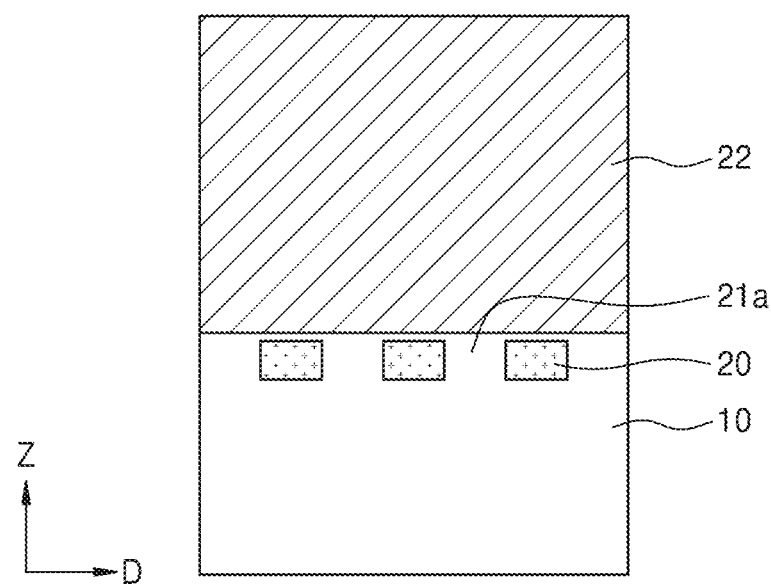

Referring to FIGS. 5A and 5B, FIG. 5A is a layout diagram of an epitaxial layer 22 on a planarized flow layer 21a. FIG. 5B is a cross-sectional diagram corresponding to line 5b-5b' in FIG. 5A. FIG. 5B is a cross-sectional diagram in the diagonal direction (D direction) and in the third direction (Z direction).

As illustrated in FIG. 5B, the planarized flow layer 21a is formed by chemical mechanical polishing the flow layer 21. The planarized flow layer 21a also may not expose the low dielectric pattern 20. A thickness of the epitaxial layer 22 on the planarized flow layer 21a is uniformly formed. When the planarized flow layer 21a is formed, a crystal growth surface of the epitaxial layer 22 is controlled. The epitaxial layer 22 may include a single crystal silicon layer. In some embodiments, the epitaxial layer 22 is formed to a thickness of about 50 nm to about 200 nm. As illustrated in FIG. 5A, the epitaxial layer 22 is formed on the entire surfaces of the low dielectric pattern 20 apart from each other in the first direction (X direction) and the second direction (Y direction).

Figure 6A:
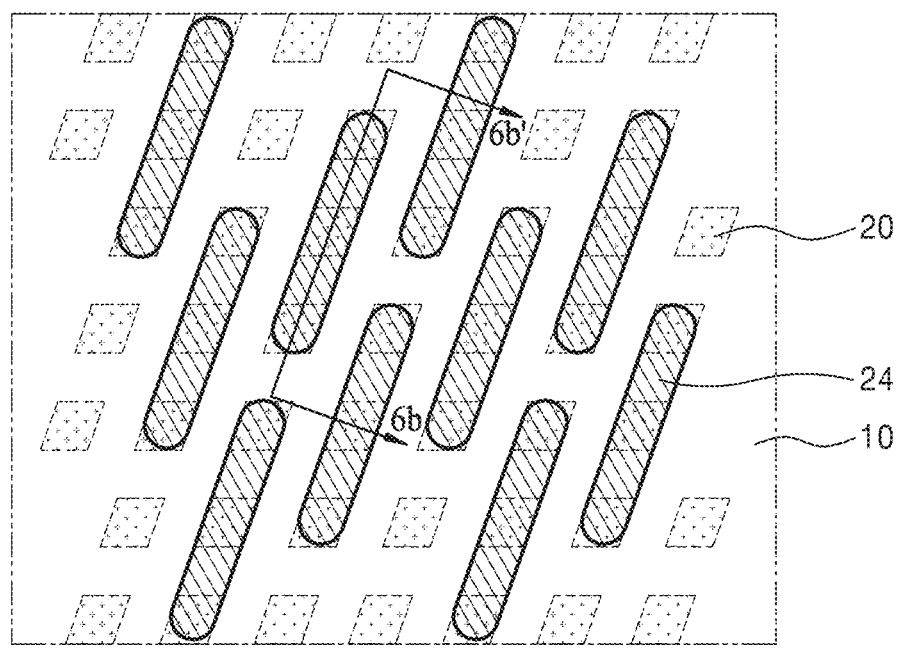
Figure 6B:
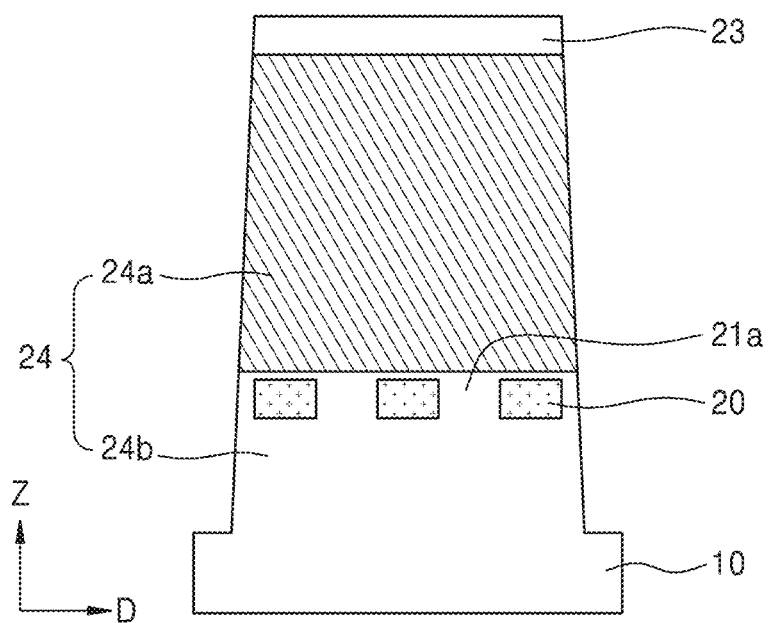
Figure 6C:
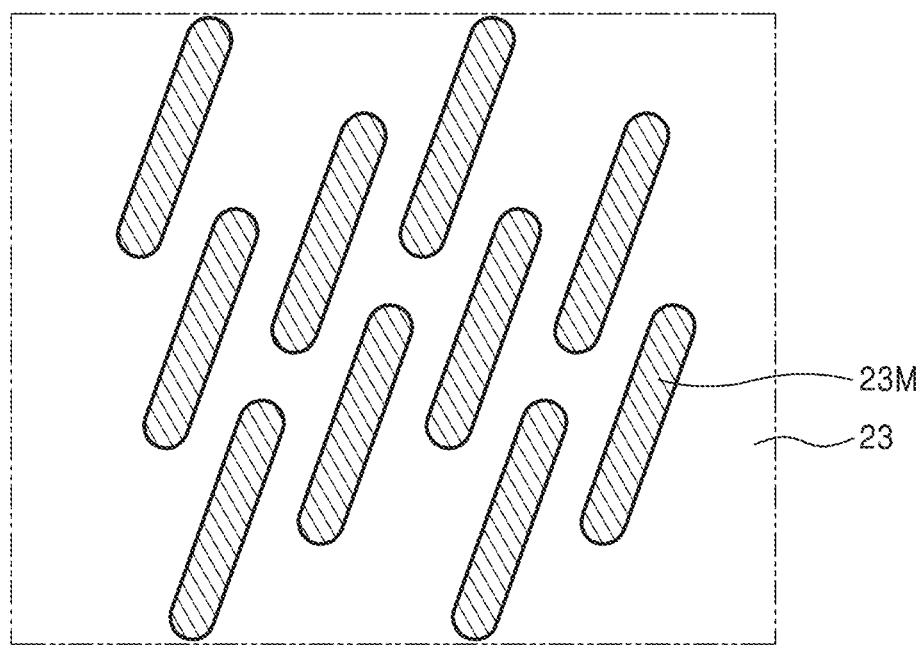

Referring to FIGS. 6A through 6C, FIG. 6A illustrates a layout diagram of active regions 24 and active masks 23M on a substrate 10 in accordance with an example embodiment. FIG. 6B illustrates a cross-sectional diagram corresponding to line 6b-6b' in FIG. 6A. FIG. 6B illustrates a cross-sectional diagram in the diagonal direction (D direction) and in the third direction (Z direction). FIG. 6C illustrates a plan view of the active mask 23M.

The active region 24 is formed by etching the epitaxial layer 22, the planarized flow layer 21a, and the substrate 10 by using an active mask 23M. The active mask 23M is on the low dielectric pattern 20 and be apart from each other in the diagonal direction (D direction), the first direction (X direction), and the second direction (Y direction). The active mask 23M is on three low dielectric patterns 20 and the planarized flow layer 21a. The active region 24 may include an epitaxial region 24a and a substrate region 24b. The low dielectric pattern 20 buried by the planarized flow layer 21a is formed in the substrate region 24b. In FIG. 6B, a material layer 23 formed on the epitaxial region 24a may include an insulating layer patterned by the active mask 23M.

Figure 7A:
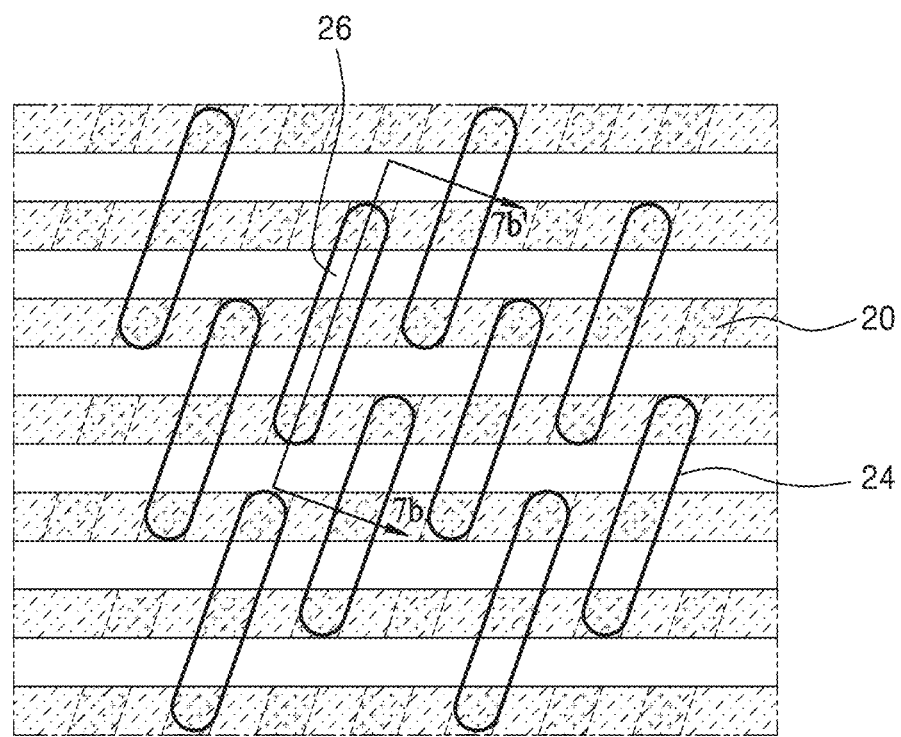
Figure 7A:
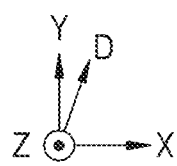
Figure 7B:
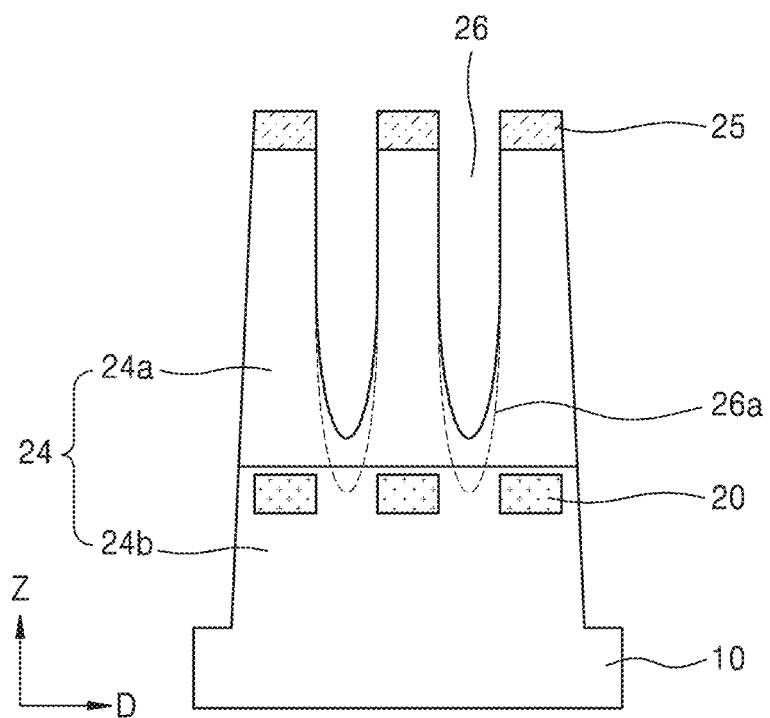
Figure 7C:
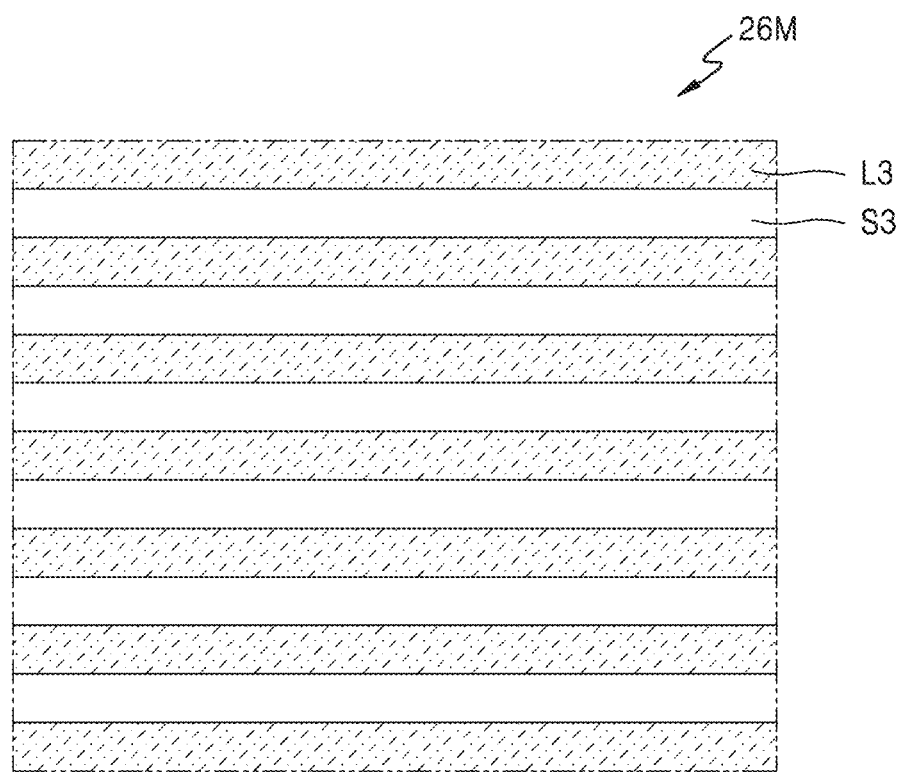

Referring to FIGS. 7A through 7C, FIG. 7A illustrates a layout diagram of a third mask 26M overlapping the low dielectric pattern 20 and the active region 24 in accordance with an example embodiment. FIG. 7B illustrates a cross-sectional diagram corresponding to line 7b-7b' in FIG. 7A. FIG. 7B illustrates a cross-sectional diagram in the diagonal direction (D direction) and in the third direction (Z direction). FIG. 7C illustrates a layout diagram of the third mask 26M.

The third mask 26M may have a shape in which lines L3 and spaces S3 are alternately arranged to be apart from each other in the second direction (Y direction) perpendicular to the first direction (X direction). The line L3 and the space S3 constituting the third mask 26M may extend in the first direction (X direction). The line L3 is formed by using a photoresist pattern.

A gate trench 26 is formed by etching the active region 24, which was previously formed, by using the third mask 26M. In other words, the gate trench 26 is formed between the low dielectric patterns 20 by etching a portion of the epitaxial region 24a by using the third mask 26M. In FIG. 7B, a material layer 25 formed on the epitaxial region 24a may include an insulating layer patterned by the third mask 26M. A deeper gate trench 26a also is formed in the first direction (X direction) in FIG. 7A using a similar etching process.

Figure 8:
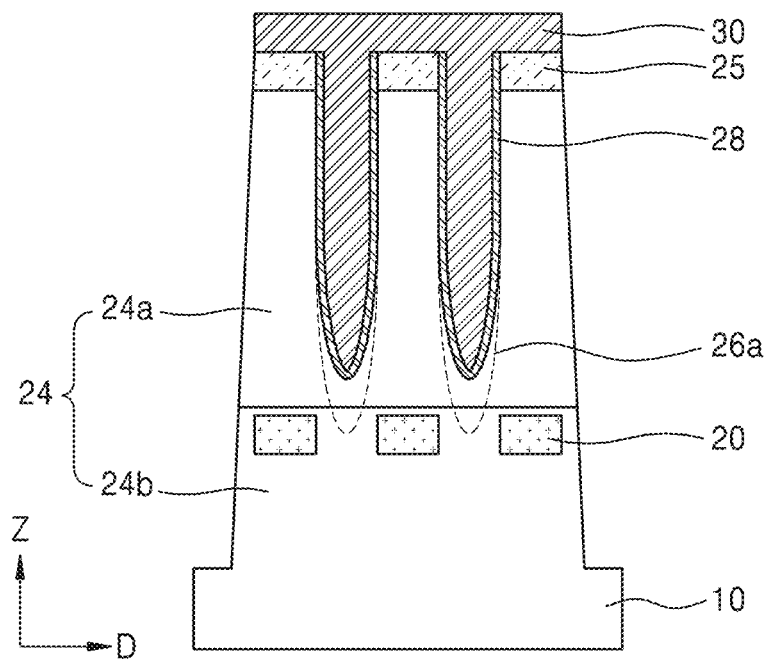
Figure 9:
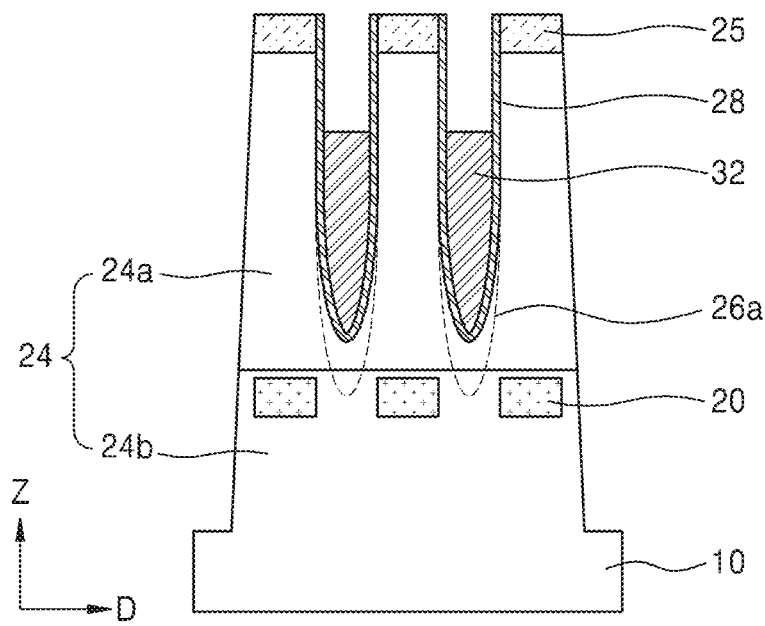
Figure 10:
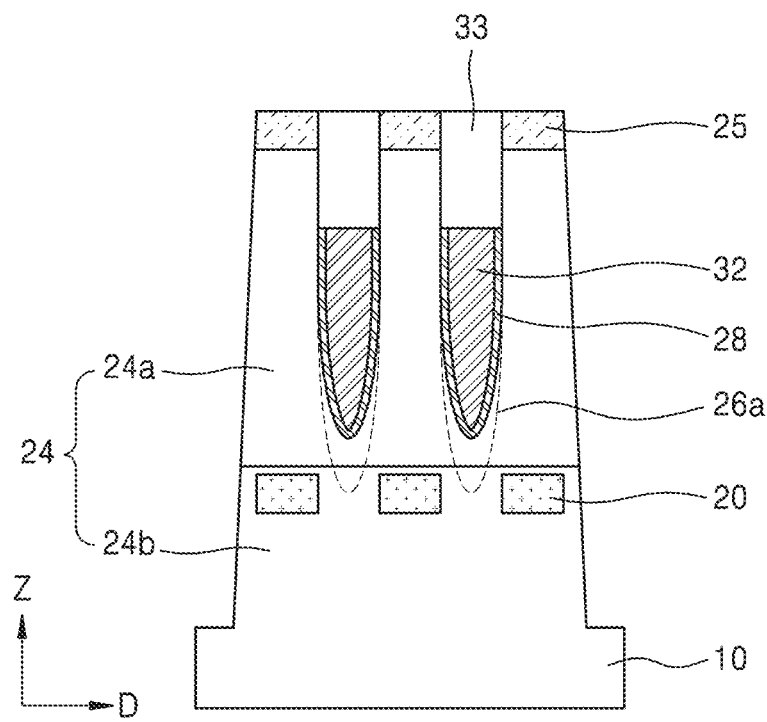

Referring to FIGS. 8 through 10, operations of forming a transistor by forming a gate insulating pattern 28 and a gate conductive pattern 32 are illustrated. As illustrated in FIG. 8, the gate insulating layers 28 is formed inside the gate trenches 26. Next, a gate conductive material layer 30 is formed on the material layer 25 while filling the gate trenches 26 on the gate insulating layers 28.

As illustrated in FIG. 9, the gate conductive layer 32 is formed by recessing the gate conductive material layer 30 into the inside of the gate trench 26. After removing the gate insulating layer 28 in the gate trench 26 as illustrated in FIG. 10, a filling insulating layer 33 is formed on the gate conductive layer 32. Next, the transistor is completed by forming a source region and a drain region in the epitaxial region 24a.

The integrated circuit semiconductor device fabricated as described above may suppress an interference effect between the gate conductive layers 32 by forming the low dielectric pattern 20 between the gate conductive layers 32 on the substrate 10. In addition, gate control is improved by suppressing depletion regions formed in the substrate 10.

Figure 11:
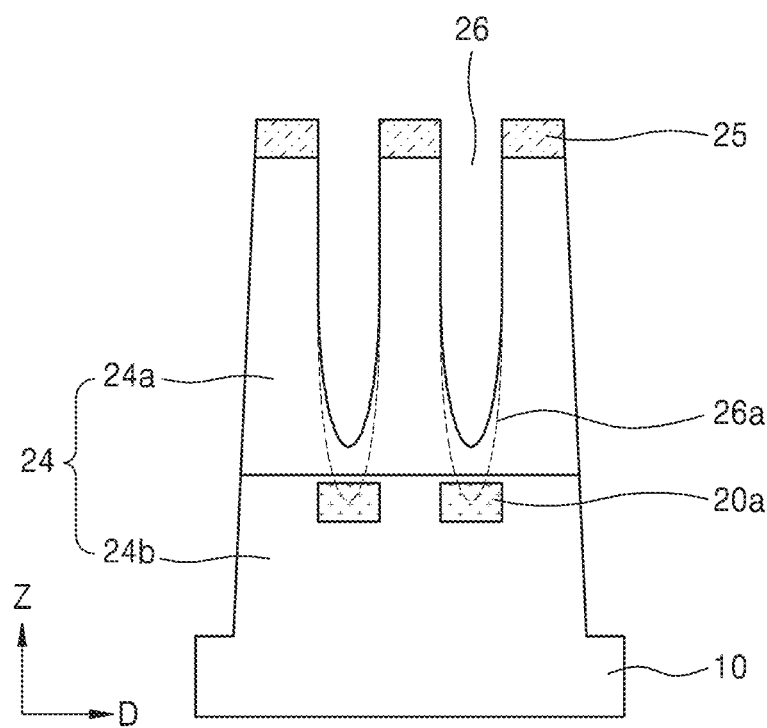
FIGS. 11 and 12 are diagrams of a fabrication method of an integrated circuit semiconductor device in accordance with an example embodiment.
Figure 12:
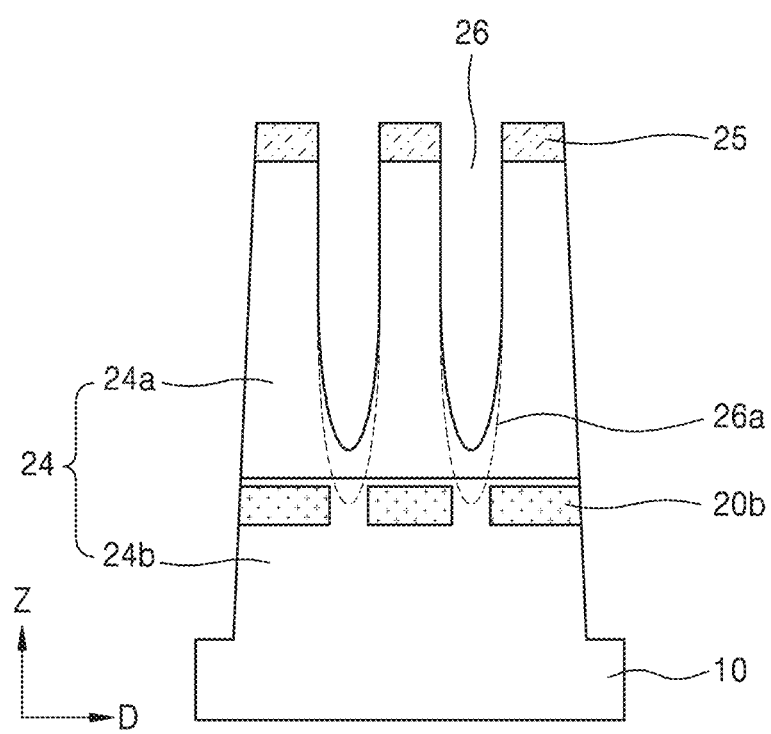

FIGS. 11 and 12 are diagrams of a fabrication method of an integrated circuit semiconductor device, according to embodiments of the technical idea of the inventive concept.

FIG. 11 is substantially similar to FIG. 7B but includes a low dielectric pattern 20a formed under the gate trench 26 in which the gate conductive layer 32 is formed. FIG. 11 illustrates a result of fabrication by changing the line L2 to a space and the space S2 to a line in the second mask 14M of FIG. 2C. In this case, the low dielectric pattern 20a is formed under the gate trench 26 in which the gate conductive pattern (32 in FIG. 9) is formed.

FIG. 12 is substantially similar to FIG. 7B except that a width of a low dielectric pattern 20b is greater than that of the low dielectric pattern 20a. FIG. 12 illustrates a result of fabrication by reducing the width of the line L2 and increasing the width of the space S2 in the second mask 14M of FIG. 2C. In this case, the low dielectric pattern 20b may have the same side surface as the active region 24, and accordingly, is exposed.

FIGS. 13A through 15D are diagrams of a fabrication method of an integrated circuit semiconductor device, in accordance with an example embodiment.

FIGS. 13A, 13E, 14A, 14B, and 15A are layout diagrams, and FIGS. 13B through 13D, 14C, and 15B through 15D are cross-sectional diagrams.

Figure 13A:
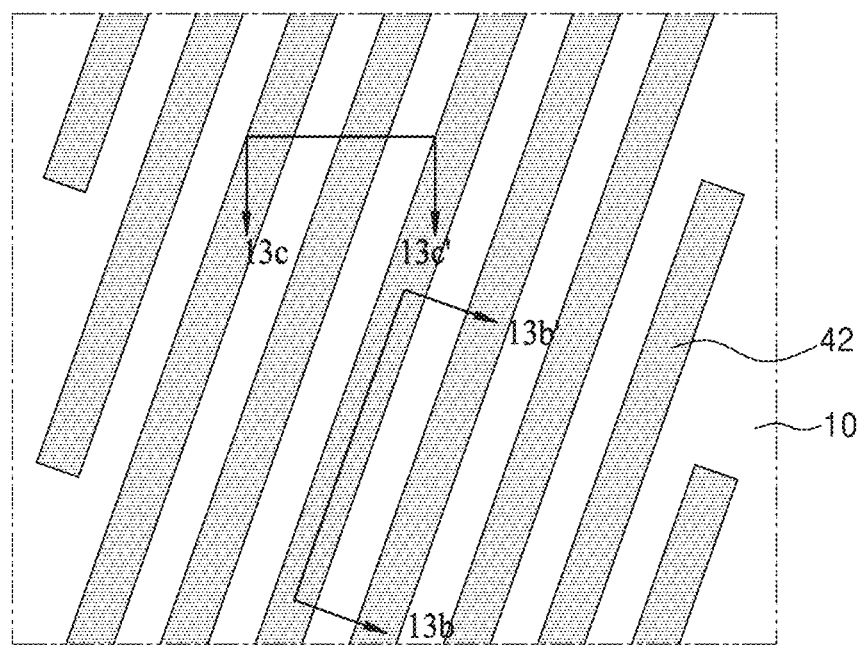
FIGS. 13A through 15D are diagrams of a fabrication method of an integrated circuit semiconductor device in accordance with an example embodiment.
Figure 13B:
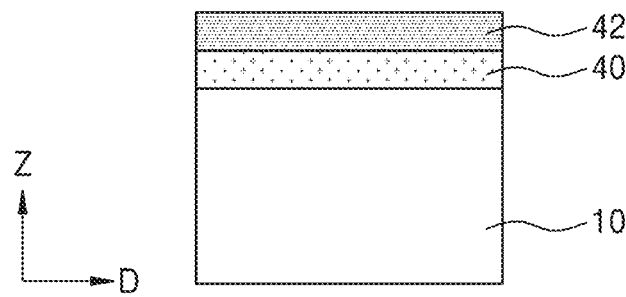
Figure 13C:
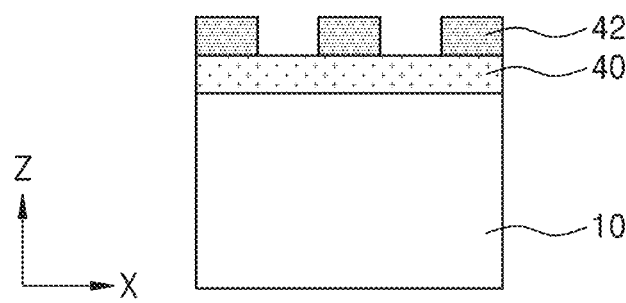
Figure 13D:
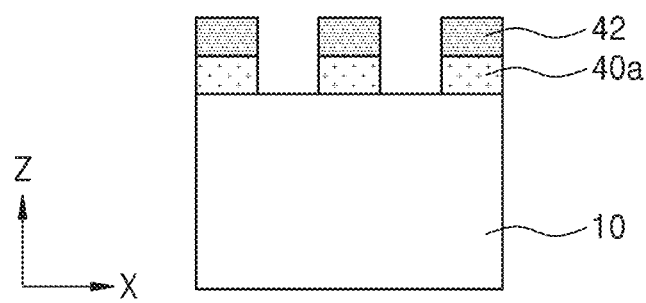
Figure 13E:
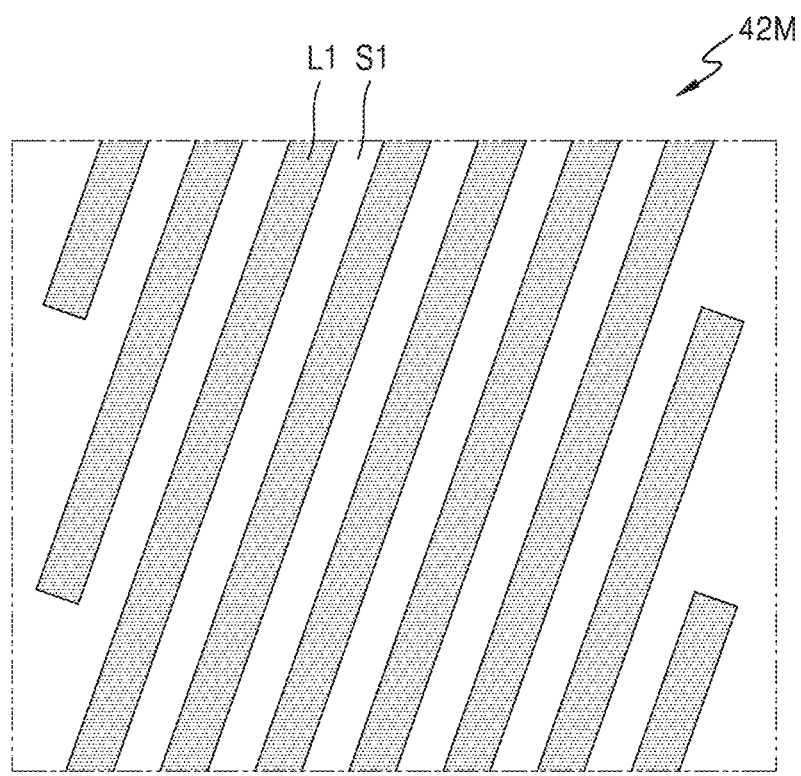

Referring to FIGS. 13A through 13E, FIG. 13A illustrates a layout diagram of the first mask patterns 42 formed on the substrate 10 in accordance with an example embodiment. FIGS. 13B and 13C illustrate cross-sectional diagrams corresponding to lines 13B-13B' and 13C-13C' in FIG. 13A, respectively. FIG. 13E illustrates a layout diagram of a first mask 42M.

As illustrated in FIGS. 13B and 13C, a low dielectric material layer 40 is formed on the substrate 10. As described above, the substrate 10 may include semiconductor materials such as silicon, germanium, silicon-germanium, or Group III-V semiconductor compounds such as GaP, GaAs, and GaSb. The low dielectric material layer 40 may include a material layer having a lower dielectric constant than the substrate 10. The low dielectric material layer 40 may include a material having a lower dielectric constant than the substrate 10. For example, the low dielectric material layer 40 may include silicon oxide.

First mask patterns 42 is formed on the low dielectric material layer 40. The first mask patterns 42 is formed by using the first mask 42M including the line L1 and the space S1. Accordingly, the first mask patterns 42 may extend in the diagonal direction (D direction) on the substrate 10. The first mask patterns 42 is apart from each other in the first direction (X direction).

The first mask patterns 42 may have a line and space shape with the lines corresponding to the line L1 of the first mask 42M, and the spaces between the first mask patterns 42 corresponding to the space S1 of the first mask 42M. The first mask patterns 42 is formed by a photoresist pattern. Although, in the present embodiment, the first mask patterns 42 extend in the diagonal direction (D direction), in some embodiments, the first mask patterns 42 may extend in the first direction (X direction) or the second direction (Y direction).

Next, a low dielectric material pattern 40a is formed by etching the low dielectric material layer 40 using the first mask patterns 42 as etching masks. The low dielectric material pattern 40a may, like the first mask patterns 42, extend in the diagonal direction (direction D). In addition, the low dielectric material patterns 40a may have a shape in which lines and spaces are alternately arranged to be apart from each other in the first direction (X direction).

Figure 14A:
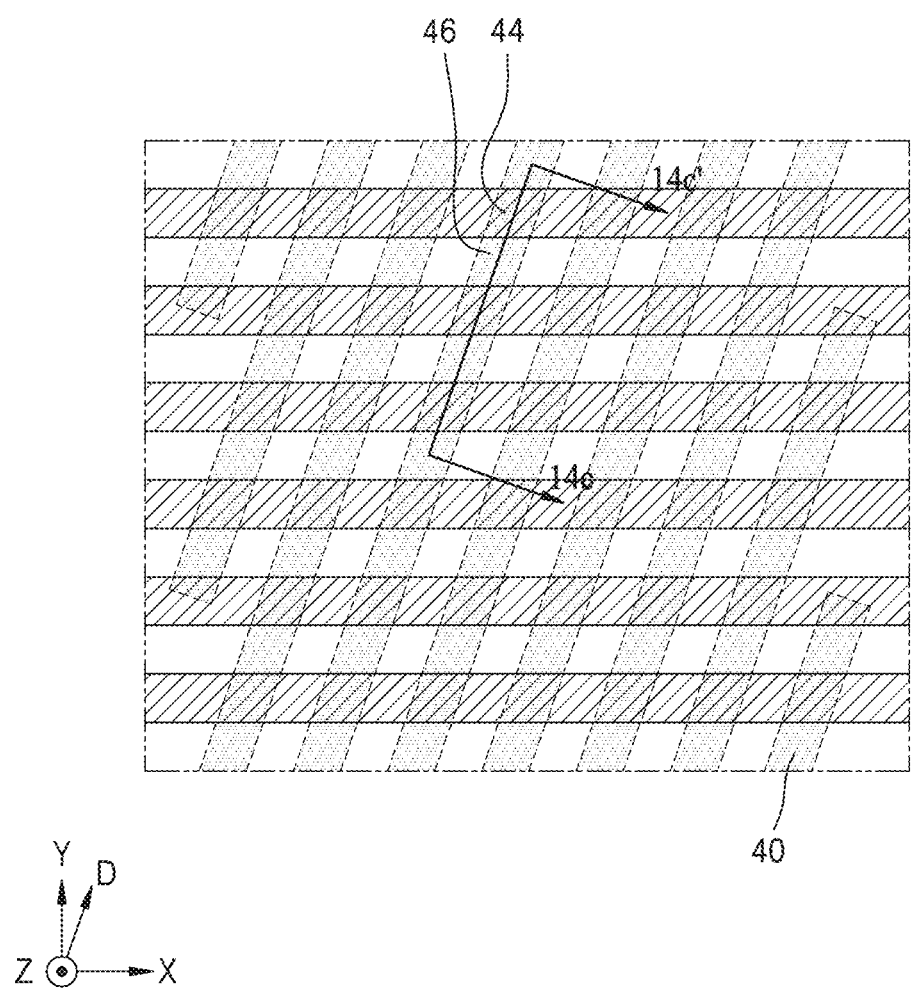
Figure 14B:
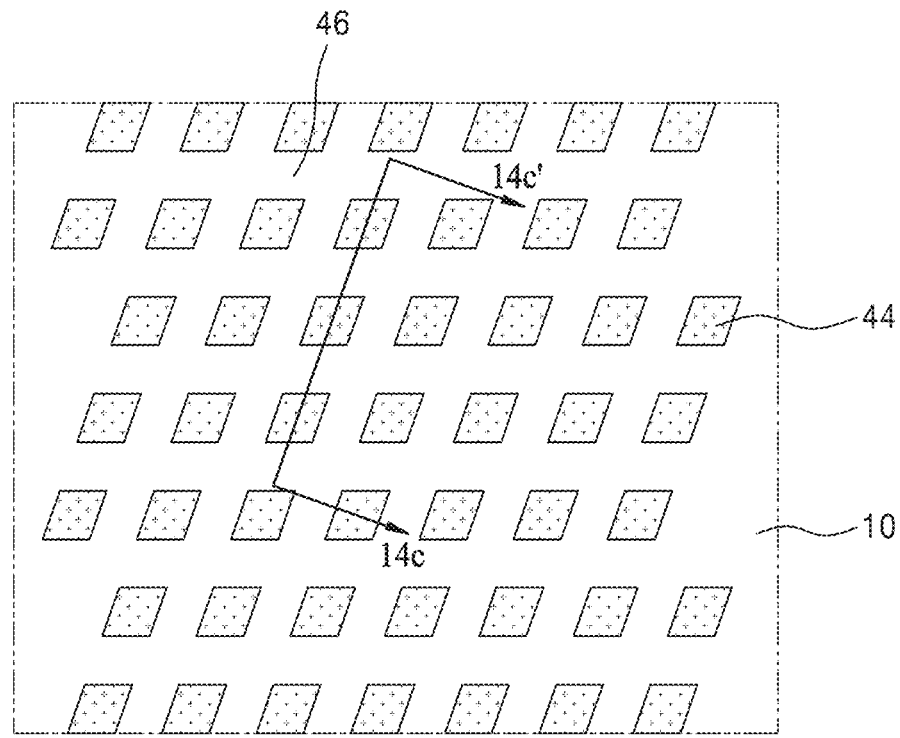
Figure 14B:
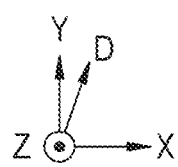
Figure 14C:
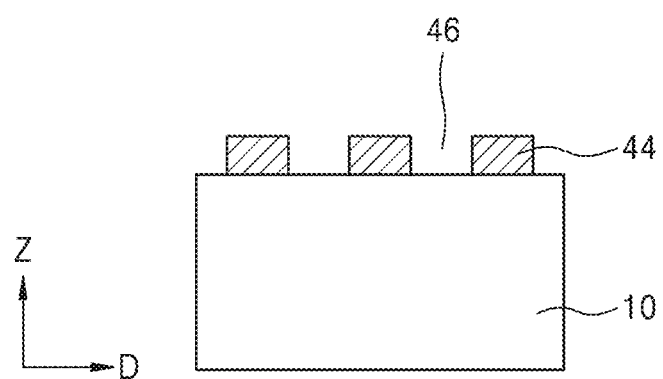
Figure 14D:
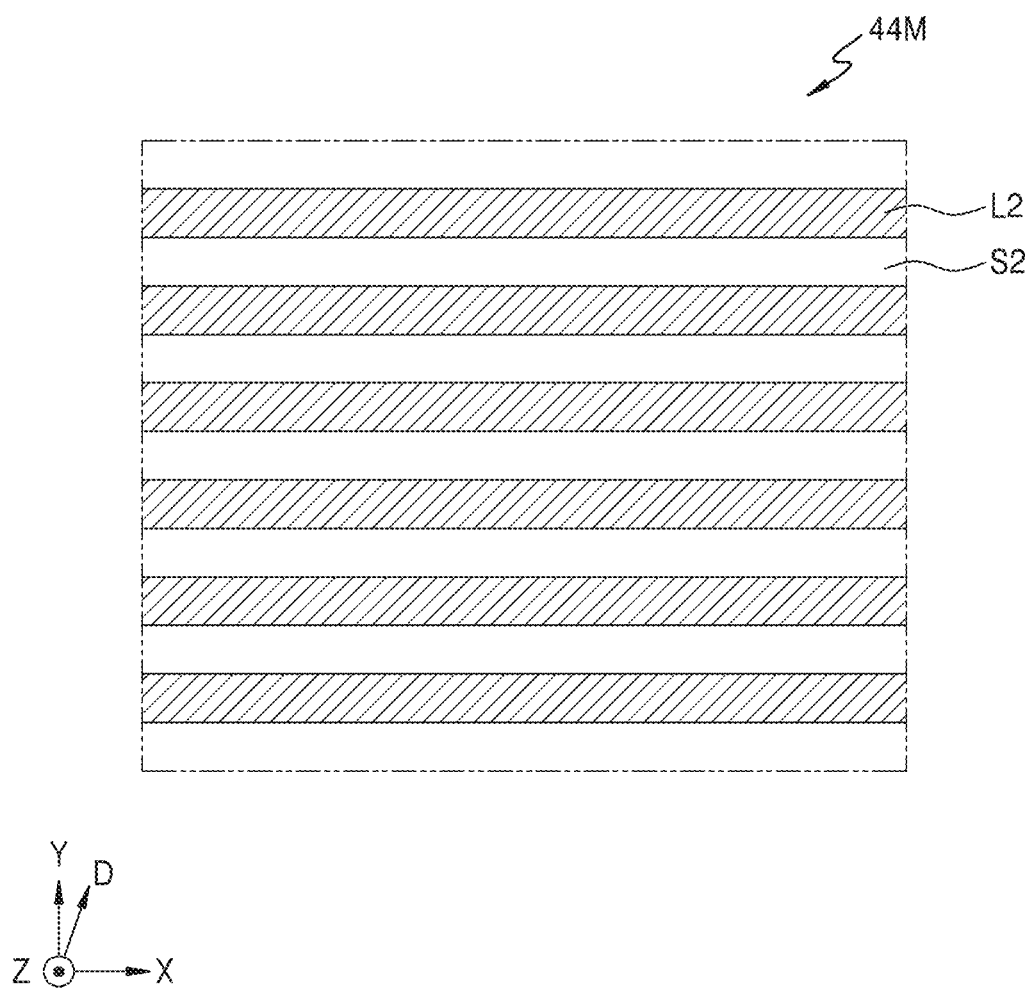

Referring to FIGS. 14A through 14D, FIG. 14A illustrates a layout diagram of a second mask 44M overlapping the low dielectric material pattern 40a. FIG. 14B is a layout diagram of a low dielectric pattern 44. FIG. 14C is a cross-sectional diagram corresponding to line 14c-14c' in FIG. 14B. FIG. 14C is a cross-sectional diagram in the diagonal direction (D direction) and in the third direction (Z direction). FIG. 14D is a layout diagram of the second mask 44M.

The low dielectric pattern 44 is formed by etching the low dielectric material pattern 40a, which was previously formed, by using the second mask 44M. The second mask 44M may have a shape in which the lines L2 and the spaces S2 are alternately arranged to be apart from each other in a second direction (Y direction) perpendicular to the first direction (X direction). The line L2 and the space S2 constituting the second mask 44M may extend in the first direction (X direction).

A surface exposing portion 46 exposing the surface of the substrate 10 is formed by etching the low dielectric material pattern 40a by using the second mask 44M. The low dielectric pattern 44 is formed at portions where the low dielectric material pattern 40a overlaps the line L2. A portion where the low dielectric material pattern 40a overlaps the space S2 is the surface exposing portion 46.

In some embodiments, as illustrated in FIG. 14C, a height of the low dielectric pattern 44 is formed between about 5 nm and about 50 nm. As illustrated in FIG. 14B, a horizontal length (or a width) in the first direction (X direction) and a vertical length (or a width) in the diagonal direction (D direction) of the low dielectric pattern 44 is determined by the size of an active region (24 in FIG. 6A), and is formed, for example, between about 5 nm and about 20 nm.

Figure 15A:
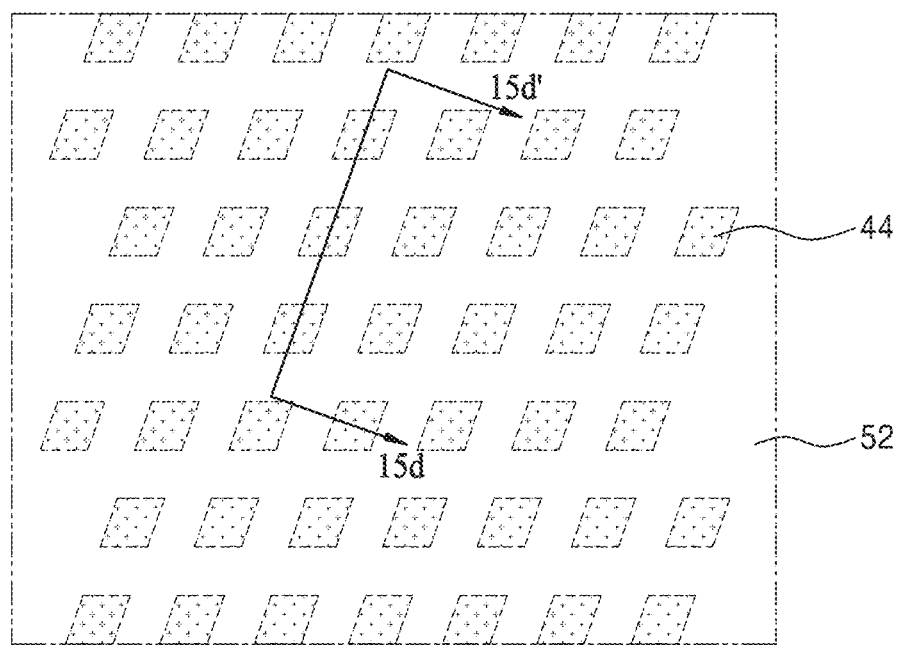
Figure 15A:
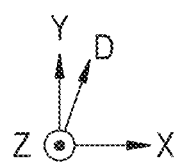
Figure 15B:
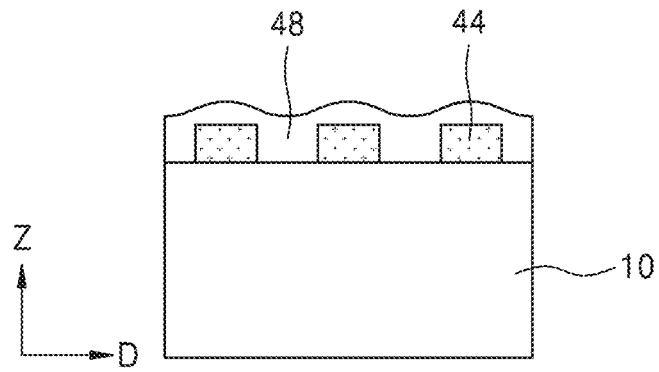
Figure 15C:
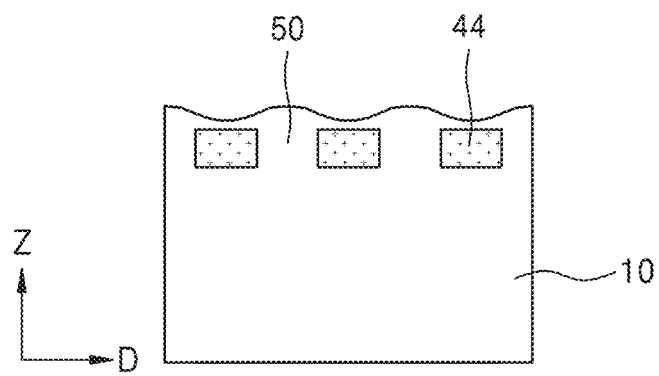
Figure 15D:
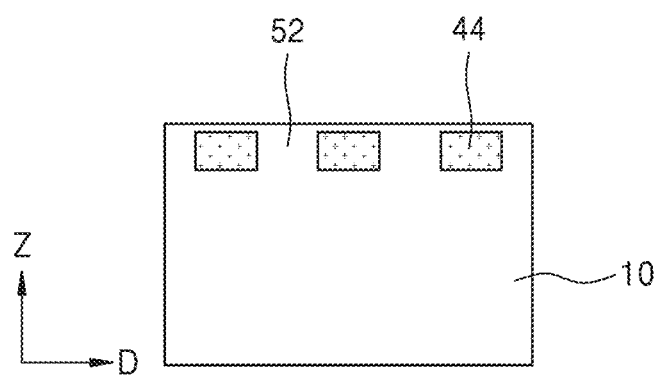

Referring to FIGS. 15A through 15D, FIG. 15A illustrates a layout diagram of the low dielectric pattern 44 and a planarized flow layer 52. FIGS. 15B and 15C are cross-sectional diagrams of intermediate fabrication operations for forming the low dielectric pattern 44, and FIG. 15D is a cross-sectional diagram corresponding to line 15d-15d' in FIG. 15A. FIGS. 15B through 15D illustrates cross-sectional diagrams in the diagonal direction (D direction) and in the third direction (Z direction).

As illustrated in FIG. 15B, a polysilicon layer 48 is formed on the low dielectric pattern 44 and the substrate 10.

As illustrated in FIG. 15C, a flow layer 50 for burying the low dielectric pattern 44 is formed by melting, laser annealing, or gas annealing a top portion of the polysilicon layer 48. In some embodiments, when the top portion of the substrate 10 is gas annealed, the gas used is hydrogen or a hydrogen-based gas. In some embodiments, when the top portion of the substrate 10 is gas annealed, the gas annealing is performed by using any one or more of hydrogen, nitrogen, argon, and helium. When the top portion of the substrate 10 is laser annealed or gas annealed, the flow temperature of the silicon atoms is further lowered.

As illustrated in FIG. 15D, a planarized flow layer 52 is formed by chemical and/or mechanical polishing the flow layer 50.

Next, as described above with reference to FIGS. 5A and 5B, the epitaxial layer 22 is formed on the planarized flow layer 52, and a transistor is formed in the epitaxial layer 22. The integrated circuit semiconductor device fabricated as described above may suppress the interference effect between the gate conductive layers 32 by forming the low dielectric pattern 44 between the gate conductive layers 32 on the substrate 10.

Hereinafter, an embodiment is described in which the above-described fabrication method of an integrated circuit semiconductor device as used to form a dynamic random-access memory (DRAM) device.

In example embodiments, a level may denote a height from a main surface of the substrate 110 in a vertical direction. In other words, that a position is at an identical or constant level may denote that a position is at an identical or constant height from the main surface of the substrate 110 in the vertical direction, and that a position is at a low or high level may denote that a position is at a less or greater height from the main surface of the substrate 110 in the vertical direction.

Figure 16:
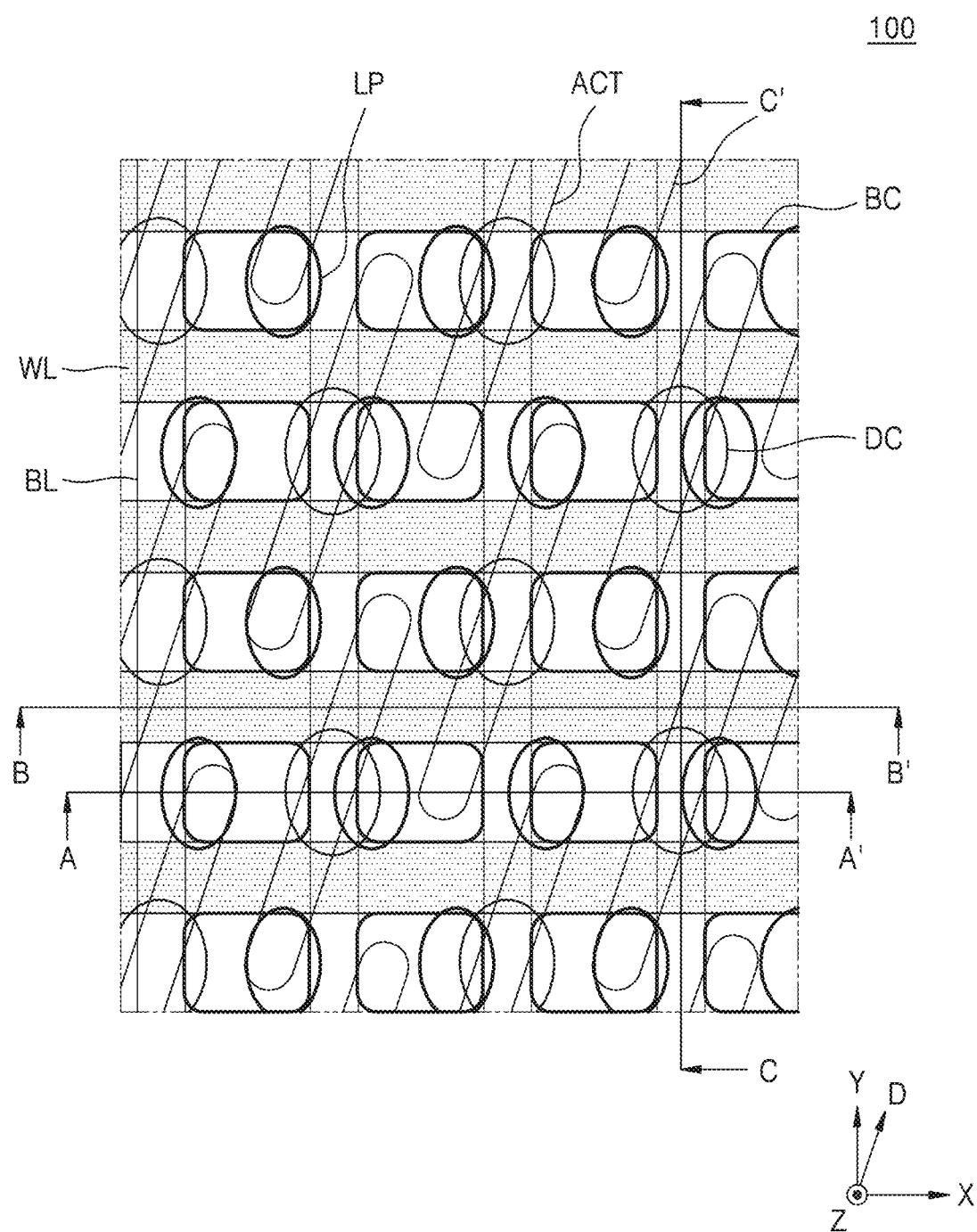
FIG. 16 is a schematic plan layout diagram of main components of a cell array region of a DRAM device in accordance with an example embodiment.

FIG. 16 is a schematic plan layout diagram of main components of a cell array region of a DRAM device 100, according to an embodiment of the technical idea of the inventive concept.

The DRAM device 100 may include a plurality of active regions ACT. In some embodiments, the plurality of active regions ACT may have a long axis in a diagonal direction (D direction) with respect to the first direction (X direction) and the second direction (Y direction).

A plurality of word lines WL may extend in parallel with each other in the first direction (X direction) across the plurality of active regions ACT. On the word lines WL, a plurality of bit lines BL may extend in parallel with each other in the second direction (Y direction) crossing the first direction (X direction).

The plurality of bit lines BL is connected to the plurality of active regions ACT via direct contacts DC. In some embodiments, a plurality of buried contacts BC is formed between two adjacent bit lines BL among the plurality of bit lines BL. The plurality of buried contacts BC may extend to a top portion of one of the two bit lines BL adjacent to each other. In some embodiments, the plurality of buried contacts BC is arranged in a line in the first direction (X direction) and the second direction (Y direction).

A plurality of landing pads LP is formed on the plurality of buried contacts BC. The plurality of buried contacts BC and the plurality of landing pads LP may connect bottom electrodes of capacitors (not shown) formed on the plurality of bit lines BL to the plurality of active regions ACT. The plurality of landing pads LP may respectively and partially overlap the plurality of buried contacts BC.

FIGS. 17 through 24 are diagrams of a fabrication method of a DRAM device, according to embodiments of the inventive concept. Each of FIGS. 17 through 24 illustrates cross-sectional views taken along lines A-A', B-B', and C-C' in FIG. 16.

Figure 17:
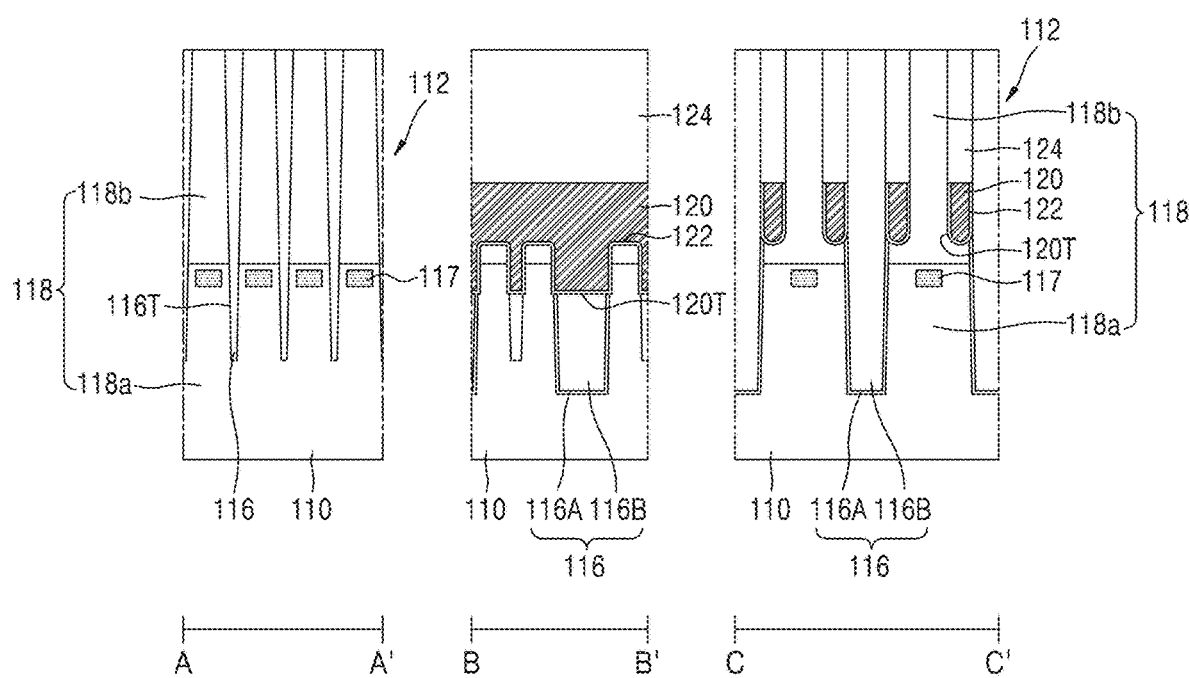
FIGS. 17 through 24 are diagrams of a fabrication method of a DRAM device in accordance with an example embodiment.

Referring to FIG. 17, an element isolation trench 116T is formed in a substrate 110 having a low dielectric pattern 117 buried therein, and in an epitaxial region 112 on the substrate 110. The low dielectric pattern 117 may include a material having a lower dielectric constant than the substrate 110. For example, the low dielectric pattern 117 may include silicon oxide. An element isolation layer 116 is formed inside the element isolation trench 116T. An active region 118 is defined in the substrate 110 by the element isolation layer 116.

In some embodiments, a height of the low dielectric pattern 117 is between about 5 nm and about 50 nm. As illustrated in FIG. 16, a horizontal length (or a width) in the first direction (X direction) and a vertical length (or a width) in the diagonal direction (D direction) of the low dielectric pattern 117 is determined according to a size of an active region (ACT in FIG. 16 or 118 in FIG. 17), and is formed, for example, between about 5 nm and about 20 nm.

The active region 118 may include a first active region 118a formed in the substrate 110 and a second active region 118b formed in the epitaxial region 112 on the substrate 110. The low dielectric pattern 117 is formed in the first active region 118a. In some embodiments, the epitaxial region 112 is formed to a thickness of about 50 nm to about 200 nm.

The low dielectric pattern 117 is formed in the central portion of the first active region 118a. A fabrication process of the epitaxial region 112 and a fabrication process of forming the low dielectric pattern 117 in the first active region 118a have been described above, and thus are omitted. The active region 118 may have a relatively long island shape having a short axis and a long axis, like the active region ACT illustrated in FIG. 16.

The substrate 110 may include, for example, silicon (Si) monocrystalline Si, polycrystalline Si, or amorphous Si. Alternatively, the substrate 110 may include at least one compound semiconductor of a semiconductor element such as germanium (Ge), silicon germanium (SiGe), silicon carbide (SiC), gallium arsenide (GaAs), indium arsenide (InAs), and indium phosphide (InP). Alternatively, the substrate 110 also may include a conductive region, for example, a well doped with impurities, or a structure doped with impurities.

The element isolation layer 116 may include, for example, at least one of a silicon oxide layer, a silicon nitride layer, and a silicon oxynitride layer. The element isolation layer 116 may include a single layer including one kind of insulating layer, a double layer including two kinds of insulating layers, or a multiple layer including a combination of at least three kinds of insulating layers.

In some embodiments, the element isolation layer 116 may include a first element isolation layer 116A and a second element isolation layer 116B. The first element isolation layer 116A and the second element isolation layer 116B may include different materials. For example, the first element isolation layer 116A may include silicon oxide, and the second element isolation layer 116B may include silicon nitride. However, a configuration of the element isolation layer 116 is not limited thereto.

A plurality of word line trenches 120T is formed in the second active region 118b. The plurality of word line trenches 120T may extend in parallel with each other in the first direction (X direction in FIG. 16) and may respectively have a line shape crossing the active region 118. As illustrated in a cross-sectional portion corresponding to the line B-B', to form the plurality of word line trenches 120T having steps formed on bottom surfaces thereof, the etching depth of the element isolation layer 116 is different from the etching depth of the second active region 118b. The respective etching of the element isolation layer 116 and the second active region 118b may be performed as separate etching processes.

The gate dielectric layer 122, the plurality of word lines 120, and the plurality of filling insulating layers 124 is formed in the plurality of word line trenches 120T after cleaning the resultant by-product created during the formation of the plurality of word line trenches 120T, is. The plurality of word lines 120 may constitute the plurality of word lines WL illustrated in FIG. 16. The word line 120 may include the gate conductive pattern 32 described above.

A top surface of each of the plurality of word lines 120 is at a level lower than that of the second active region 118b. Bottom surfaces of the plurality of word lines 120 may have a concave-convex shape, and saddle-type fin transistors (saddle FinFETs) is formed in the plurality of active regions 118.

In some embodiments, after the plurality of word lines 120 are formed, impurity ions is implanted into portions of the second active regions 118b on both sides of the plurality of word lines 120, and source/drain regions is formed on top surfaces of the plurality of active regions 118. In some other embodiments, an impurity ion implantation process for forming the source/drain regions is performed before the plurality of word lines 120 are formed. In some embodiments, the plurality of word lines 120 may include Ti, TiN, Ta, TaN, W, WN, TiSiN, WSiN, or a combination thereof.

The gate dielectric layer 122 may include at least one of a silicon oxide layer, a silicon nitride layer, a silicon oxynitride layer, an oxide/nitride/oxide (ONO) layer, and a high dielectric layer having a higher dielectric constant than the silicon oxide layer. For example, the gate dielectric layer 122 may have a dielectric constant of about 10 to about 25. In some embodiments, the gate dielectric layer 122 may include a metal-based dielectric layer including at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

Top surfaces of the plurality of filling insulating layers 124 is at substantially the same level as the top surfaces of the second active regions 118b. The plurality of filling insulating layers 124 may include one of a silicon oxide layer, a silicon nitride layer, a silicon oxynitride layer, and a combination thereof.

Figure 18:
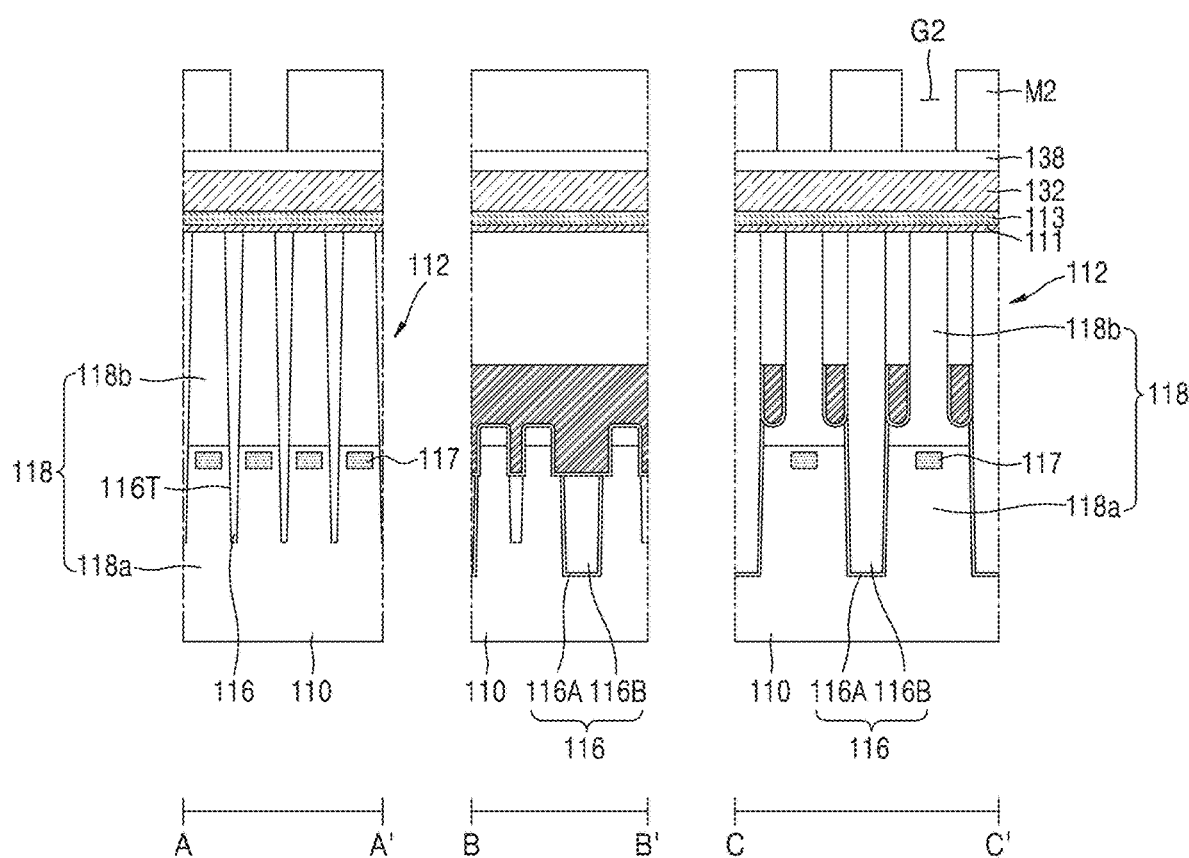

Referring to FIG. 18, a first insulating layer 111 and a second insulating layer 113 is formed on the element isolation layer 116, the second active region 118b, and the filling insulating layer 124. The first insulating layer 111 may include a non-metal dielectric layer. For example, the first insulating layer 111 may include a silicon oxide layer, a silicon nitride layer, a silicon oxynitride layer, or a combination thereof. The second insulating layer 113 may include a metal dielectric layer. The second insulating layer 113 may have a dielectric constant greater than the first insulating layer 111. For example, the second insulating layer 113 may include at least one of the materials constituting the gate dielectric layer 122 as described above.

Next, a first conductive layer 132 is formed on the second insulating layer 113. The first conductive layer 132 may include, for example, a doped semiconductor material. In some embodiments, the first conductive layer 132 may include a doped polysilicon layer. A hard mask layer 138 is formed on the first conductive layer 132. Next, a second photoresist pattern M2 is formed on the hard mask layer 138.

The hard mask layer 138 may include any material having a sufficient etching selectivity with respect to the first conductive layer 132, and is not particularly limited. For example, the hard mask layer 138 may include a carbon-based material like an amorphous carbon layer (ACL), a hydrocarbon compound having a relatively high carbon content of about 85 wt % to about 99 wt % based on the total weight of the carbon, a spin-on hard mask (SOH) layer, etc.

The second photoresist pattern M2 is formed, by applying photoresist on the hard mask layer 138 and patterning the photoresist through exposure and development. In this case, the second photoresist pattern M2 may have an opening G2 partially exposing the hard mask layer 138.

Figure 19:
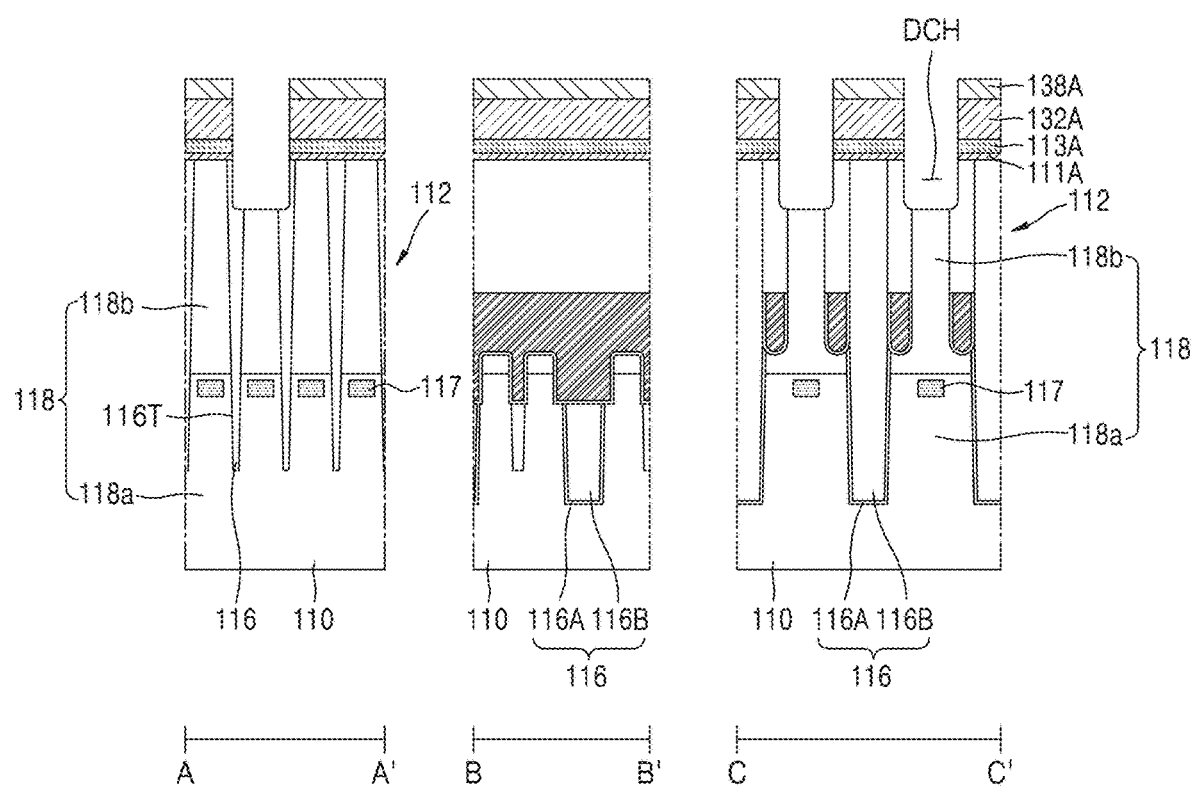

Referring to FIG. 19, a hard mask pattern 138A is formed, by etching portions of the hard mask layer (138 in FIG. 18) exposed through the opening (G2 in FIG. 18) of the second photoresist pattern (M2 in FIG. 18). Next, by using the hard mask pattern 138A as an etching mask, top portions of the first conductive layer (132 in FIG. 18), the second insulating layer (113 in FIG. 18), the first insulating layer (111 in FIG. 18), and the second active region (118b in FIG. 18) is etched.

As a result, a direct contact hole DCH exposing the second active region 118b is formed. In addition, a first conductive pattern 132A, a second insulating pattern 113A, and a first insulating pattern 111A defining the direct contact hole DCH is formed. In some embodiments, a level of a bottom surface of the direct contact hole DCH is lower than a level of the top surface of the second active region 118b.

Figure 20:
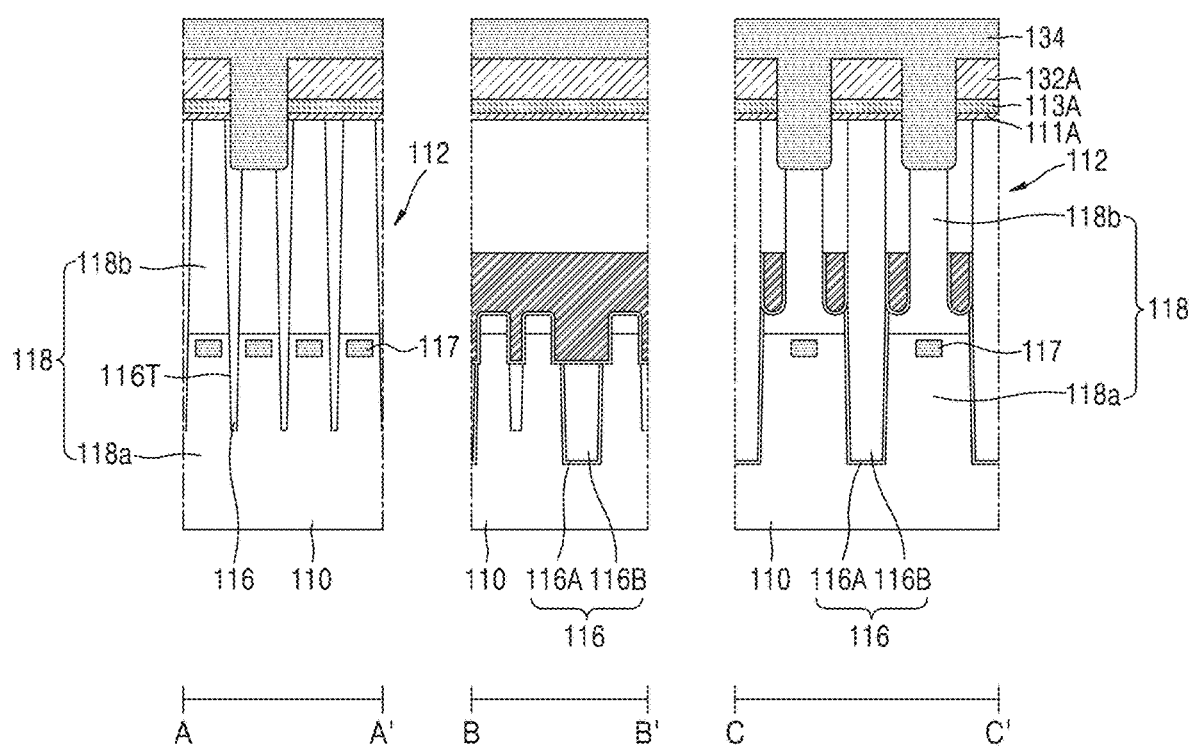

Referring to FIG. 20, the hard mask pattern (138A in FIG. 19) is removed. The hard mask pattern 138A is removed by using an ashing and strip process. In addition, the removal process of the hard mask pattern 138A is performed under a condition in which etching of the first conductive pattern 132A is suppressed.

In some embodiments, after the hard mask pattern 138A is removed, a silicon treatment process is performed. The silicon treatment process is a process to generate a good surface state by lightly etching or cleaning the surface of the second active region 118b and the like, which may have been damaged in the etching process described above with reference to FIG. 19. Next, a cleaning process to remove native oxide, other contaminants, and the like is performed.

Next, a second conductive layer 134 is formed that fills the direct contact holes (DCH in FIG. 19) and covers the top surface of the first conductive pattern 132A. The second conductive layer 134 may include, for example, a doped semiconductor material. In some embodiments, the second conductive layer 134 may include a doped polysilicon layer.

In other words, both the second conductive layer 134 and the first conductive layer (132 in FIG. 18) may include a doped semiconductor material, for example, doped polysilicon. In addition, doping concentration of the second conductive layer 134 is greater than that of the first conductive layer 132. However, configurations of the first conductive layer 132 and the second conductive layer 134 are not limited thereto.

Figure 21:
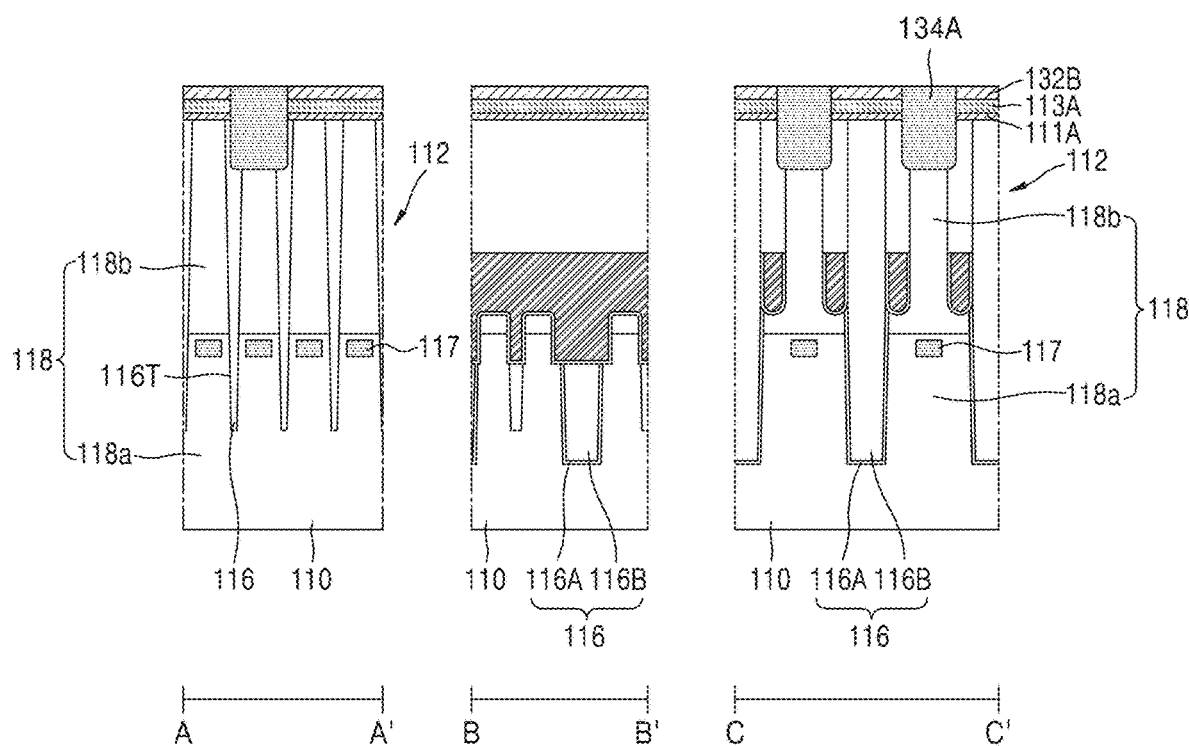

Referring to FIG. 21, a direct contact 134A and a thinned first conductive pattern 132B is formed by etching the entire surface of the second conductive layer (134 in FIG. 20) and the first conductive pattern (132A in FIG. 20). The entire surface etching process is performed by using an etch-back method or a chemical mechanical polishing (CMP) method. By using the entire surface etching process, a portion of the top side of the first conductive pattern 132A is removed, and thus the thinned first conductive pattern 132B having a thickness less than the first conductive pattern 132A is formed.

A top surface of each of the direct contact 134A and the thinned first conductive pattern 132B is exposed, and a level of the top surface of the direct contact 134A is the same as that of the top surface of the thinned first conductive pattern 132B. Next, both sides of the direct contact 134A and the thinned first conductive pattern 132B may form an interface there between, and be in contact with each other. However, configurations of the direct contact 134A and the thinned first conductive pattern 132B are not limited thereto.

Figure 22:
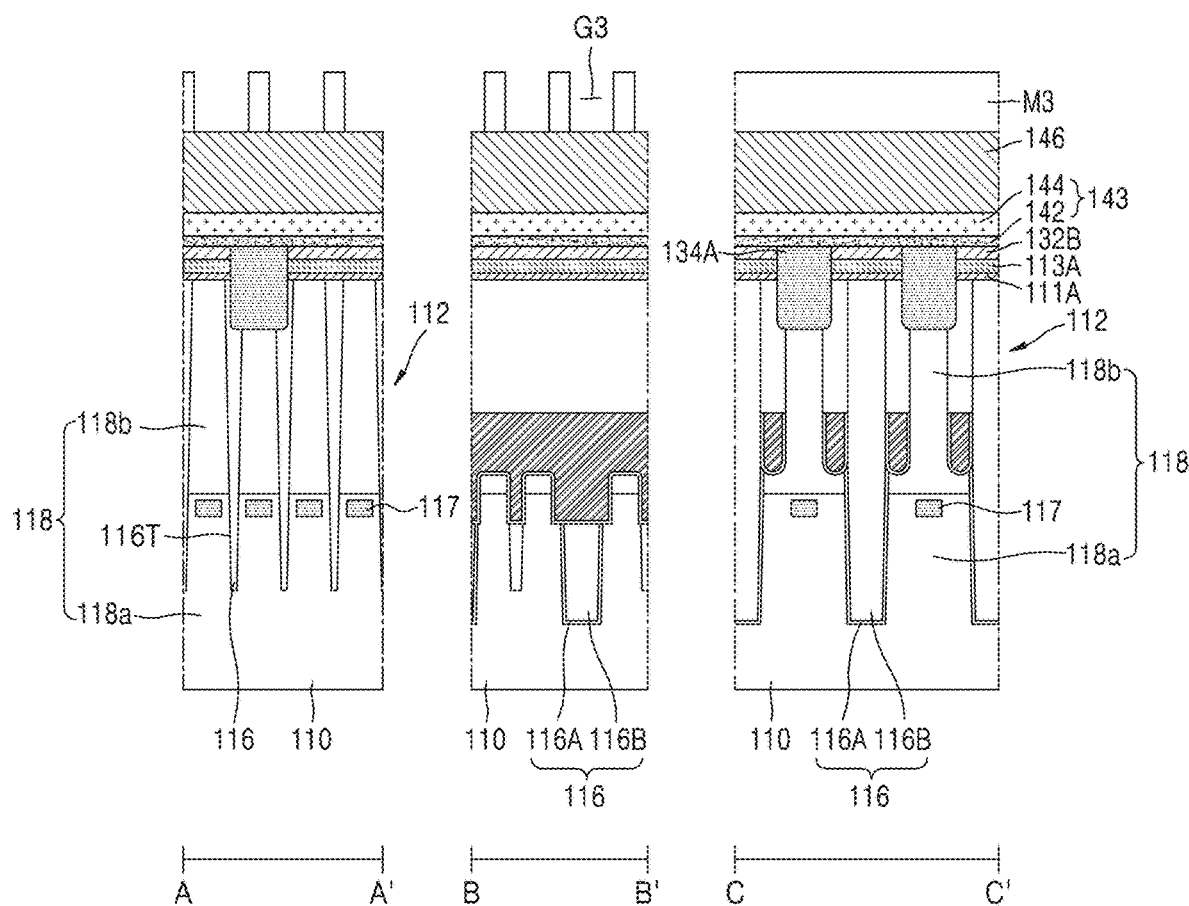

Referring to FIG. 22, a metal layer 143 covering the direct contact 134A and the thinned first conductive pattern 132B is formed. Next, an insulating capping layer 146 is formed on the metal layer 143. In some embodiments, the metal layer 143 may have a stacked structure of a bottom metal layer 142 and a top metal layer 144. In FIG. 22, the metal layer 143 illustrated as having a two-story conductive layer stacked structure including the bottom metal layer 142 and the top metal layer 144, but the technical idea of the inventive concept is not limited thereto. For example, the metal layer 143 may have a plurality of stacked structures of a single layer or three or more layers.

In some embodiments, the bottom metal layer 142 may include titanium nitride (TiN) or Ti—Si—N (TSN). In addition, the top metal layer 144 may include tungsten (W) or tungsten silicide (WSix). In some embodiments, the bottom metal layer 142 may function as a diffusion barrier.

The insulating capping layer 146 is formed on the metal layer 143. The insulating capping layer 146 may include, for example, a silicon nitride layer. In some embodiments, a thickness of the insulating capping layer 146 is greater than that of the metal layer 143.

Next, a third photoresist pattern M3 is formed on the insulating capping layer 146. A photoresist is coated on the insulating capping layer 146, and the third photoresist pattern M3 is formed by patterning the photoresist through exposure and development. In this case, the third photoresist pattern M3 may include an opening G3 partially exposing the insulating capping layer 146.

Figure 23:
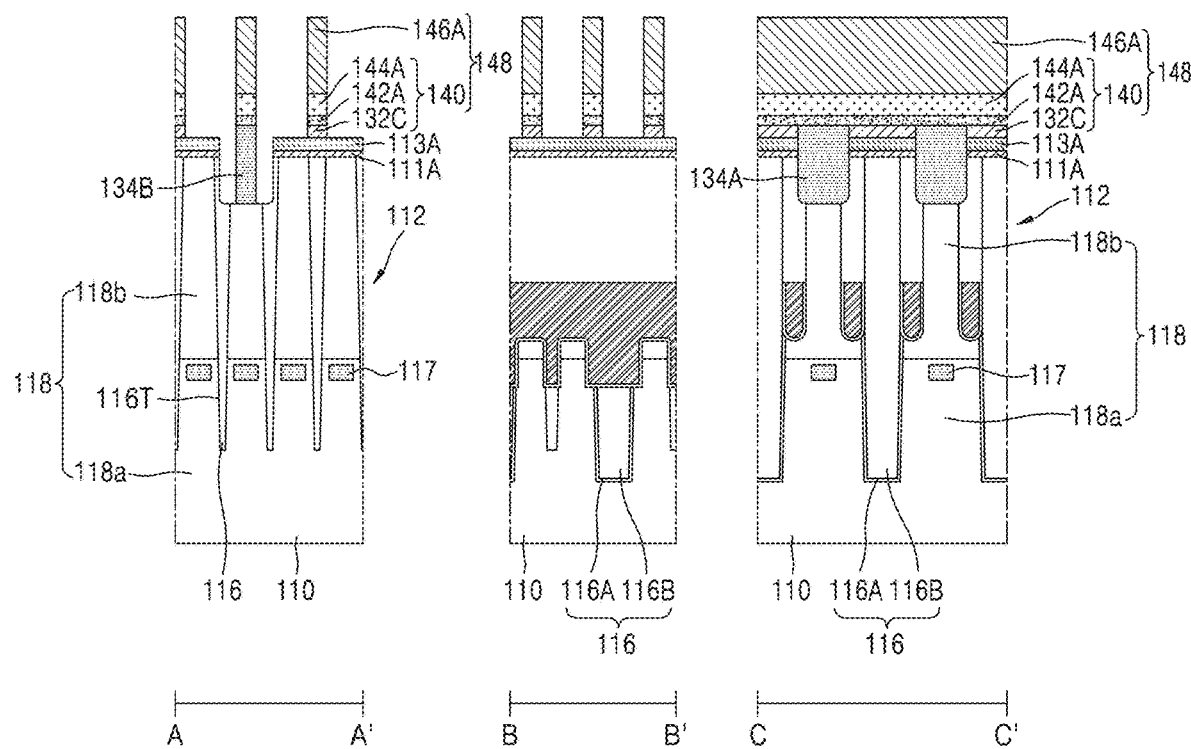

Referring to FIG. 23, a bit line structure 148 is formed on the second active region 118b. The thinned first conductive pattern (132B in FIG. 22), the bottom metal layer (142 in FIG. 22), the top metal layer (144 in FIG. 22), and the insulating capping layer (146 in FIG. 22) is etched by using the third photoresist pattern (M3 in FIG. 22) as an etching mask. As a result, a plurality of bit lines 140 including a line-shaped thinned first conductive line 132C, a bottom metal line 142A, and a top metal line 144A is formed. Next, a plurality of insulating capping lines 146A is formed on the plurality of bit lines 140. One bit line 140 and one insulating capping line 146A may constitute one bit line structure 148.

Each of the plurality of bit lines 140 and each of the plurality of insulating capping lines 146A may extend in parallel with each other in the second direction (Y direction in FIG. 16). The plurality of bit lines 140 may constitute the plurality of bit lines BL illustrated in FIG. 16.

In an etching process for forming the plurality of bit lines 140, a direct contact conductive pattern 134B is formed by etching together a portion of the direct contact 134A which does not overlap the bit line 140 in a direction perpendicular to the main surface of the substrate 110. In some embodiments, a level of a top surface of the direct contact conductive pattern 134B is higher than that of the top surface of the second insulating pattern 113A.

The plurality of bit lines 140 may have a vertically stacked structure that includes the thinned first conductive line 132C including doped polysilicon but is not relatively thick.

Figure 24:
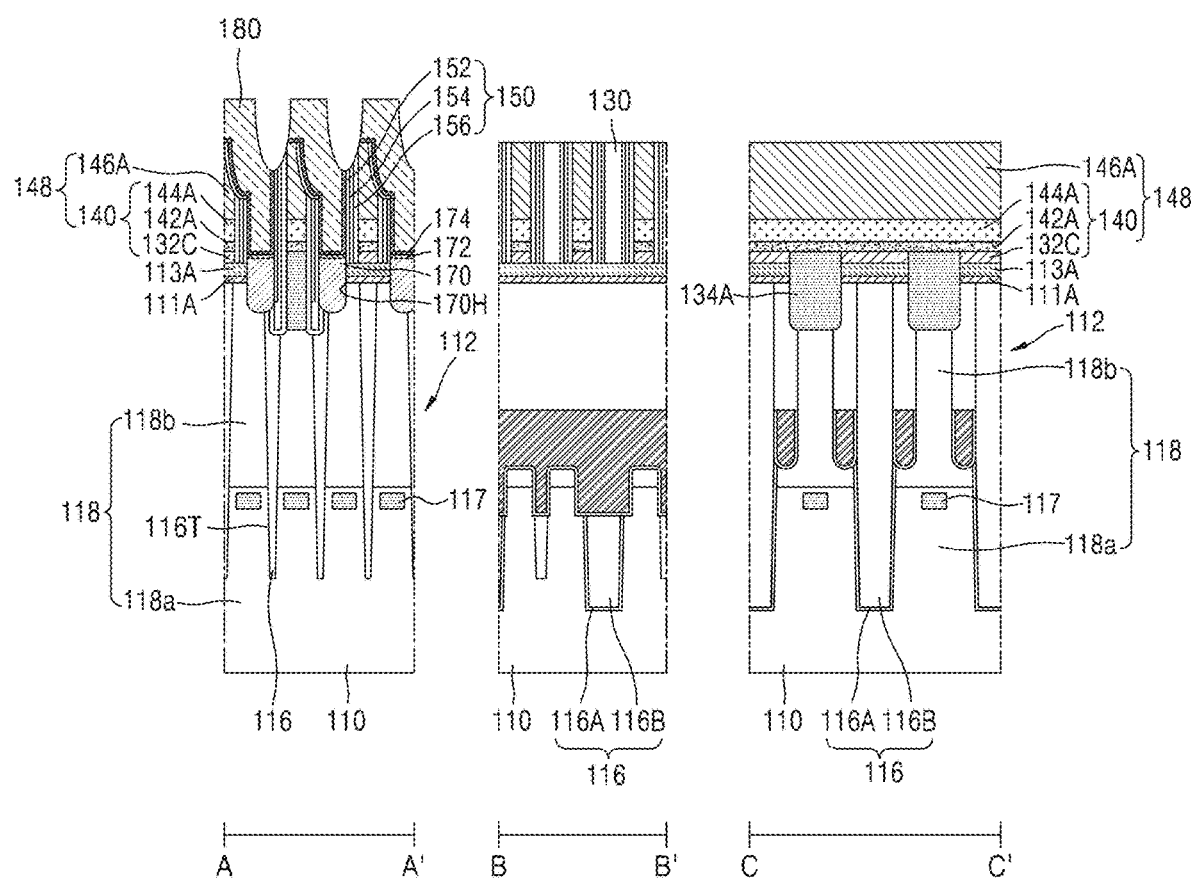

Referring to FIG. 24, the DRAM device 100 including the plurality of bit line structures 148 is formed. Both sidewalls of each of the plurality of bit line structures 148 is covered by an insulating spacer structure 150. Each of the plurality of insulating spacer structures 150 may include a first insulating spacer 152, a second insulating spacer 154, and a third insulating spacer 156.

In some embodiments, each of the first insulating spacer 152, the second insulating spacer 154, and the third insulating spacer 156 may include a silicon oxide layer, a silicon nitride layer, a silicon oxynitride layer, or a combination thereof. In some other embodiments, each of the first insulating spacer 152 and the third insulating spacer 156 may include a silicon oxide layer, a silicon nitride layer, a silicon oxynitride layer, or a combination thereof, and the second insulating spacer 154 between the first insulating spacer 152 and the third insulating spacers 156 may include an air spacer.

A plurality of buried contact holes 170H is formed between the plurality of bit lines 140. The plurality of buried contact holes 170H may have an inside space that is limited by the insulating spacer structure 150 covering sidewalls of each of two neighboring bit lines 140 between two neighboring bit lines 140 among the plurality of bit lines 140, and by the active region 118.

The plurality of buried contacts 170 is connected to the plurality of active regions 118 and a plurality of landing pads 180 and is formed inside the plurality of buried contact holes 170H between the plurality of bit lines 140. The plurality of buried contacts 170 and the plurality of landing pads 180 may correspond to the plurality of buried contacts BC and the plurality of landing pads LP illustrated in FIG. 16, respectively.

The plurality of buried contacts 170 may extend from the active region 118 in the third direction (Z direction in FIG. 16) perpendicular to the substrate 110. The plurality of landing pads 180 is respectively on the buried contacts 170, and may extend onto the plurality of bit lines 140. The plurality of landing pads 180 is connected to the active region 118 via the plurality of buried contacts 170.

The landing pad 180 is electrically connected to the buried contact 170, and is formed to extend from the inside of the buried contact hole 170H to the top surface of the plurality of bit line structures 148 such that the landing pad 180 vertically overlaps the plurality of bit line structures 148.

The landing pad 180 may extend in the third direction (Z direction in FIG. 16) perpendicular to the main surface of the substrate 110 in an area between the plurality of bit lines 140, and may cover at least a portion of the top surface of the plurality of bit lines 140 such that the landing pad 180 vertically overlaps at least a portion of the plurality of bit lines 140.

A metal silicide layer 172 is formed between the buried contact 170 and the landing pad 180. The metal silicide layer 172 may include cobalt silicide (CoSi), nickel silicide (NiSi), or manganese silicide (MnSi), but is not limited thereto.

A conductive barrier layer 174 is formed between the landing pad 180 and the insulating spacer structure 150, and between the landing pad 180 and the plurality of bit line structures 148. The conductive barrier layer 174 may include a metal, a conductive metal nitride, or a combination thereof. For example, the conductive barrier layer 174 may have a Ti/TiN stacked structure.

An insulating layer 130 is formed around the bit line structure 148 and the insulating spacer structure 150. The insulating layer 130 may include a silicon oxide layer, a silicon nitride layer, a silicon oxynitride layer, or a combination thereof.

The landing pad 180 is formed by using a chemical vapor deposition (CVD) method or a physical vapor deposition (PVD) method. In some embodiments, the landing pad 180 may include a metal, metal nitride, conductive polysilicon, or a combination thereof. For example, the landing pad 180 may include tungsten (W).

Figure 25:
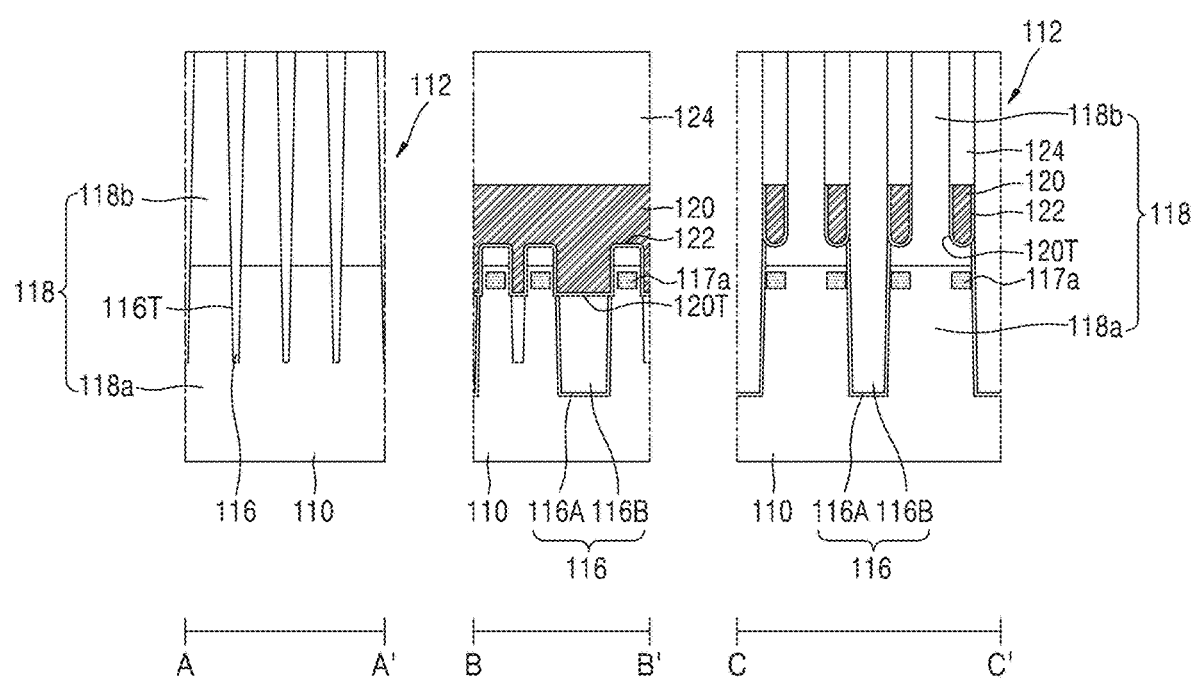
FIGS. 25 and 26 are diagrams of a fabrication method of a DRAM device in accordance with an example embodiment.
Figure 26:
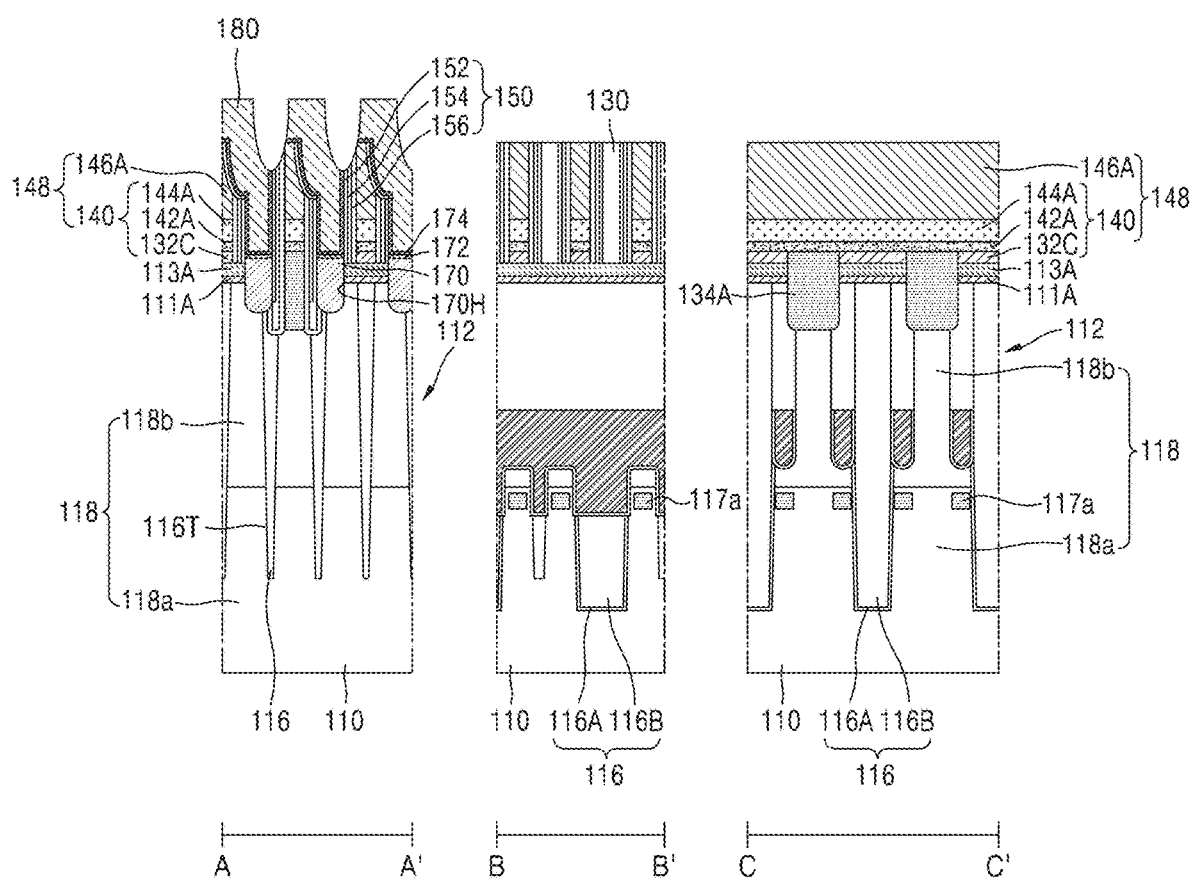

FIGS. 25 and 26 are diagrams of a fabrication method of a DRAM device, according to embodiments of the inventive concept. Each of FIGS. 25 and 26 illustrates cross-sectional views taken along lines A-A', B-B', and C-C' in FIG. 16.

When compared with the fabrication method of FIGS. 17 through 24, the fabrication method of the DRAM device of FIGS. 25 and 26 is identical or substantially similar to the fabrication method of FIGS. 17 through 24 except that a low dielectric pattern 117a is formed under the word lines 120.

In FIGS. 25 and 26, the same reference numerals as those in FIGS. 17 through 24 may denote the same members. Since the descriptions of the fabrication method given with reference to FIGS. 17 through 24 are identical or substantially similar, descriptions with reference to FIGS. 25 and 26 are briefly given or omitted.

Referring to FIG. 25, the element isolation trench 116T is formed in the substrate 110 having the low dielectric pattern 117 buried therein, and in the epitaxial region 112 on the substrate 110. The low dielectric pattern 117a may include a material having a lower dielectric constant than the substrate 110. For example, the low dielectric pattern 117a may include a silicon oxide layer. An element isolation layer 116 is formed inside the element isolation trench 116T. An active region 118 is defined in the substrate 110 by the element isolation layer 116.

The active region 118 is divided into the first active region 118a formed in the substrate 110 and the second active region 118b formed in the epitaxial region 112 on the substrate 110. The low dielectric pattern 117a is formed in the first active region 118a.

The low dielectric pattern 117a is formed near the element isolation layer 116 on both sides of the first active region 118a. In some embodiments, the low dielectric pattern 117a is formed to contact the element isolation layer 116 on both sides of the first active region 118a. A fabrication process of the epitaxial region 112 and a fabrication process of forming the low dielectric pattern 117a in the first active region 118a have been described above, and thus are omitted.

The plurality of word line trenches 120T is formed in the second active region 118b. The low dielectric pattern 117a is formed under the word line trench 120T. The gate dielectric layer 122, the plurality of word lines 120, and the plurality of buried insulating layers 124 is sequentially formed inside the plurality of word line trenches 120T. The low dielectric pattern 117a is formed under the word line 120.

Impurity ions is implanted into portions of the second active regions 118b on both sides of the plurality of word lines 120, and the source/drain regions is formed on the top surface of the plurality of active regions 118.

Referring to FIG. 26, the fabrication process of FIGS. 18 through 24 described above is performed. The DRAM device is completed by forming the bit line structure 148, the landing pad 180, and the like through the fabrication process of FIGS. 18 through 24. In the DRAM device of FIG. 26, the low dielectric pattern 117a is formed under the word lines 120.

An example embodiment of a fabrication method of an integrated circuit semiconductor device may include an operation of burying in a substrate a low dielectric layer having a lower dielectric constant than the substrate, and an operation of forming an epitaxial layer on the substrate having the low dielectric layer buried therein after the low dielectric pattern is buried. Through the fabrication process, the integrated circuit semiconductor device of the inventive concept may suppress an interference effect between transistors.

While the inventive concept has been particularly shown and described with reference to embodiments thereof, it will be understood that various changes in form and details is made therein without departing from the spirit and scope of the following claims.

What is claimed is:
1. A fabrication method for an integrated circuit semiconductor device, the fabrication method comprising:
    forming a low dielectric pattern on a substrate, the low dielectric pattern having a lower dielectric constant than the substrate;

flowing a flow layer to bury the low dielectric pattern in the substrate;
forming an epitaxial layer on the flow layer; and
forming one or more transistors comprising the low dielectric pattern buried by the flow layer.

2. The fabrication method of claim 1, wherein the forming the low dielectric pattern comprises:
forming a plurality of trenches apart from each other in the substrate; and
forming a low dielectric material inside the trenches to form the low dielectric pattern.

3. The fabrication method of claim 2, wherein the flowing the flow layer includes flowing a top portion of the substrate such that the low dielectric pattern is buried.

4. The fabrication method of claim 3, wherein the flowing the flow layer includes melting, laser annealing, or gas annealing the top portion of the substrate.

5. The fabrication method of claim 1, wherein the forming the low dielectric pattern comprises:
forming a low dielectric material layer on the substrate; and
forming the low dielectric pattern by patterning the low dielectric material layer.

6. The fabrication method of claim 5, wherein the flowing of the flow layer comprises:
forming a polysilicon layer to bury the low dielectric pattern on the substrate; and
flowing the polysilicon layer.

7. The fabrication method of claim 6, wherein the flowing the flow layer includes melting, laser annealing, or gas annealing the polysilicon layer.

8. The fabrication method of claim 1 further comprising planarizing the flow layer.

9. The fabrication method of claim 1, wherein the forming the one or more transistors comprises:
forming an active region by etching the substrate comprising the epitaxial layer and the flow layer;
forming a plurality of gate trenches apart from each other in the active region;
forming a gate insulating layers inside the gate trenches; and
forming a gate conductive layers on the gate insulating layers inside the gate trenches.

10. The fabrication method of claim 9, wherein the low dielectric pattern is buried in the substrate comprising the flow layer between a first gate trench and a second gate trench, or buried in the substrate comprising the flow layer under the gate conductive layers.

11. A fabrication method for an integrated circuit semiconductor device, the fabrication method comprising:
forming a plurality of trenches apart from each other on a substrate;
forming a low dielectric pattern inside the trenches, the low dielectric pattern having a lower dielectric constant than the substrate;
flowing a flow layer to bury the low dielectric pattern inside the trenches;
forming an epitaxial layer on the flow layer; and
forming one or more transistors in the substrate comprising the low dielectric pattern buried by the flow layer and in the epitaxial layer.

12. The fabrication method of claim 11, wherein,
surfaces of the substrate are defined in a first direction, a second direction is perpendicular to the first direction, and a diagonal direction is between the first direction and the second direction, and
the plurality of trenches are formed apart from each other in the diagonal direction.

13. The fabrication method of claim 11, wherein surfaces of the substrate are defined in a first direction, a second direction is perpendicular to the first direction, and a diagonal direction is between the first direction and the second direction, and the forming the plurality of trenches comprises:
forming a plurality of first mask patterns extending in the diagonal direction on the substrate, the plurality of first mask patterns being apart from each other in a line and space shape in the first direction on the substrate;
forming a plurality of second mask patterns apart from each other in the first direction by etching the first mask patterns; and
forming the trenches by etching the substrate by using the second mask patterns as an etching mask.

14. The fabrication method of claim 11, wherein the forming the low dielectric pattern comprises:
forming a low dielectric material layer inside the trenches and on at least a surface of the substrate, the low dielectric material layer having a lower dielectric constant than the substrate;
forming the low dielectric pattern inside the trenches by etch-backing the low dielectric material layer; and
wherein the flowing the flow layer includes melting, laser annealing, or gas annealing a top portion of the substrate.

15. The fabrication method of claim 11, wherein the forming the one or more transistors comprises:
forming an active region by etching the epitaxial layer, the flow layer, and the substrate;
forming a plurality of gate trenches apart from each other in the active region; and
forming a plurality of gate insulating layers and gate conductive layers inside the gate trenches,
wherein the low dielectric pattern is buried in the substrate comprising the flow layer between the gate conductive layers, or are buried in the substrate comprising the flow layer under the gate conductive layers, or are formed in contact with one side of the active region.

16. A fabrication method for an integrated circuit semiconductor device, the fabrication method comprising:
forming a low dielectric pattern on a substrate, the low dielectric pattern having a lower dielectric constant than the substrate;
forming a polysilicon layer to bury the low dielectric pattern on the substrate;
forming a flow layer by flowing the polysilicon layer;
forming an epitaxial layer on the flow layer; and
forming one or more transistors in the substrate comprising the low dielectric pattern buried by the flow layer and in the epitaxial layer.

17. The fabrication method of claim 16, wherein,
when surfaces of the substrate are defined in a first direction, a second direction is perpendicular to the first direction, and a diagonal direction is between the first direction and the second direction, and
the low dielectric pattern is formed apart from each other in the diagonal direction.

18. The fabrication method of claim 16, wherein surfaces of the substrate are defined in a first direction, a second direction is perpendicular to the first direction, and a diagonal direction is between the first direction and the second direction, and the forming the low dielectric pattern comprises:

forming a low dielectric material layer on the substrate, forming a plurality of first mask patterns extending in the diagonal direction on the substrate, the plurality of first mask patterns being apart from each other in a line and space shape in the first direction;

forming a low dielectric material pattern by etching the low dielectric material layer by using the first mask patterns as an etching mask;

forming a plurality of second mask patterns extending in the first direction on the low dielectric material pattern, the plurality of second mask patterns being apart from each other in a line and space shape in the second direction; and forming the low dielectric pattern by etching the low dielectric material pattern by using the second mask patterns as an etching mask.

19. The fabrication method of claim 16, wherein the forming the flow layer comprises melting, laser annealing, or gas annealing the polysilicon layer.

20. The fabrication method of claim 16, wherein the forming the one or more transistors comprises:
   forming an active region by etching the epitaxial layer, the flow layer, and the substrate;
   forming a plurality of gate trenches apart from each other in the active region; and
   forming a gate insulating layer and a gate conductive layer inside the gate trenches,
   wherein the low dielectric pattern is buried in the substrate comprising the flow layer between the gate conductive layer and a second gate conductive layer, or buried in the substrate comprising the flow layer under the gate conductive layer and the second gate conductive layer.

* * * * *